United States Patent
Hayashi et al.

(10) Patent No.: US 9,368,322 B2
(45) Date of Patent: Jun. 14, 2016

(54) INSPECTION APPARATUS

(71) Applicant: EBARA CORPORATION, Tokyo (JP)

(72) Inventors: Takehide Hayashi, Tokyo (JP);
Masahiro Hatakeyama, Tokyo (JP);
Shinji Yamaguchi, Tokyo (JP); Masato Naka, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 0 days.

(21) Appl. No.: 14/677,086

(22) Filed: Apr. 2, 2015

(65) Prior Publication Data
US 2015/0287570 A1 Oct. 8, 2015

(30) Foreign Application Priority Data
Apr. 4, 2014 (JP) .................................. 2014-077591

(51) Int. Cl.
H01J 37/26 (2006.01)
H01J 37/22 (2006.01)
H01J 37/28 (2006.01)

(52) U.S. Cl.
CPC .............. *H01J 37/222* (2013.01); *H01J 37/28* (2013.01); *H01J 2237/10* (2013.01); *H01J 2237/2448* (2013.01); *H01J 2237/2806* (2013.01)

(58) Field of Classification Search
USPC ................. 250/305, 306, 307, 309, 310, 311
See application file for complete search history.

(56) References Cited

U.S. PATENT DOCUMENTS

| | | | |
|---|---|---|---|
| 6,265,719 B1 | 7/2001 | Yamazaki et al. | |
| 2002/0028399 A1 | 3/2002 | Nakasuji et al. | |
| 2005/0045821 A1* | 3/2005 | Noji et al. | 250/311 |
| 2009/0224151 A1 | 9/2009 | Hatakeyama et al. | |
| 2012/0074316 A1 | 3/2012 | Watanabe et al. | |
| 2012/0235036 A1* | 9/2012 | Hatakeyama et al. | 250/310 |
| 2014/0077078 A1* | 3/2014 | Hatakeyama et al. | 250/310 |
| 2014/0091215 A1 | 4/2014 | Watanabe et al. | |

FOREIGN PATENT DOCUMENTS

| | | |
|---|---|---|
| JP | H11-132975 A | 5/1999 |
| JP | 2007-48686 A | 2/2007 |
| WO | 02/01596 A1 | 1/2002 |

* cited by examiner

*Primary Examiner* — Nicole Ippolito
(74) *Attorney, Agent, or Firm* — Pearne & Gordon LLP

(57) ABSTRACT

An inspection apparatus includes beam generation means, a primary optical system, a secondary optical system and an image processing system. Irradiation energy of the beam is set in an energy region where mirror electrons are emitted from the inspection object as the secondary charged particles due to the beam irradiation. The secondary optical system includes a camera for detecting the secondary charged particles, a numerical aperture whose position is adjustable along an optical axis direction and a lens that forms an image of the secondary charged particles that have passed through the numerical aperture on an image surface of the camera. In the image processing system, the image is formed under an aperture imaging condition where the position of the numerical aperture is located on an object surface to acquire an image.

4 Claims, 36 Drawing Sheets

(a) Prior Arts (b) Embodiment (a)

← FOCUS →
MINUS DIRECTION          PLUS DIRECTION (b)

MIRROR ELECTRONS FROM SAMPLE SURFACE

SECONDARY SYSTEM APERTURE

MIRROR ELECTRONS FROM DEFECTS (a)

DEFECT SIZE = SMALL

DEFECT SIZE = LARGE

◀──────── FOCUS ────────▶
MINUS DIRECTION          PLUS DIRECTION (b)

(a) CASE OF NORMAL INCIDENCE (b) CASE WHERE INCIDENT ANGLE TILTS IN Y AXIS DIRECTION (c) CASE WHERE INCIDENT ANGLE TILTS IN X AXIS DIRECTION (a) CASE WHERE ELECTRIC FIELD OF E×B IS WEAKENED (b) CASE WHERE ELECTRIC FIELD OF E×B IS ENHANCED (a)

(b)

(a) Prior Arts (b) Embodiment

INSPECTION APPARATUS

CROSS-REFERENCE TO RELATED APPLICATIONS

This application claims the benefit of Japanese Priority Patent Application JP 2014-077591 filed on Apr. 4, 2014, the entire contents of which are incorporated herein by reference.

FIELD

The present technology relates to an inspection apparatus that inspects defects of a pattern formed on a surface of an inspection object, and specifically, to an inspection apparatus that captures secondary charged particles varying properties of a surface of an inspection object, forms image data, and inspects a pattern and the like formed on the surface of the inspection object on the basis of the image data at a high throughput, and an inspection method.

BACKGROUND AND SUMMARY

A conventional semiconductor inspection apparatus supports a 100 nm design rule and technologies. Samples as inspection objects are wafers, exposure masks, EUV masks, NIL (nanoimprint lithography) masks, and substrates; the samples have thus been varying. At present, apparatuses and technologies that support a design rule for samples with 5 to 30 nm are required. That is, it is required to support L/S (line/space) or hp (half pitch) nodes of 5 to 30 nm in a pattern. In the case where an inspection apparatus inspects such samples, it is required to achieve a high resolution.

Here, "samples" are exposure masks, EUV masks, nanoimprint mask (and templates), semiconductor wafers, substrates for optical elements, substrates for optical circuits and the like. The samples include samples with patterns and samples without patterns. The samples with patterns include samples with asperities and samples without asperities. Patterns are formed of different materials on the samples without asperities. The samples without patterns include samples coated with an oxide film and samples with no oxide film.

Problems of the conventional inspection apparatuses are summarized as follows.

A first problem is insufficient resolution and throughput. In a conventional art of a mapping optical system, the pixel size is about 50 nm, and the aberration is about 200 nm. Achievement of further high resolution and improvement of the throughput require reduction in aberration, reduction in energy width of irradiation current, a small pixel size, and increase in current intensity.

A second problem is that, in the case of SEM inspection, the finer the structure to be inspected, the more serious the throughput problem is. This problem occurs because the resolution of an image is insufficient if a smaller pixel size is not used. These points are caused because the SEM forms an image and inspects defects on the basis of edge contrast. For instance, in the case of a pixel size of 5 nm and 200 MPPS, the throughput is approximately 6 hr/cm$^2$. This example takes a time 20 to 50 times as long as the time of mapping projection. The time is unrealistic for inspection.

Such conventional inspections are disclosed in WO2002/001596, JP2007-48686A and JP1999(H11)-132975

However, in a conventional inspection apparatus, it is difficult to inspect irregularities in a surface of an inspection object with high contrast and also to detect very small foreign matters. Thus, it has been desired to further improve the technology for inspecting irregularities in a surface of an inspection object with high contrast.

It is desirable to provide an inspection apparatus capable of inspecting irregularities in a surface of an inspection object with high contrast.

One embodiment is an inspection apparatus including beam generation means that generates any of charged particles and electromagnetic waves as a beam, a primary optical system that irradiates an inspection object held in a working chamber with the beam, a secondary optical system that detects secondary charged particles occurring from the inspection object and an image processing system that forms an image on the basis of the detected secondary charged particles, in which irradiation energy of the beam is set in an energy region where mirror electrons are emitted as the secondary charged particles from the inspection object due to the beam irradiation, the secondary optical system includes a camera for detecting the secondary charged particles, a numerical aperture whose position is adjustable along an optical axis direction and a lens that forms an image of the secondary charged particles that have passed through the numerical aperture on an image surface of the camera, and in the image processing system, the image is formed under an aperture imaging condition where the position of the numerical aperture is located on an object surface to acquire an image.

BRIEF DESCRIPTION OF THE DRAWINGS

FIG. 5A is a side view. FIG. 5B is a sectional view taken along line E-E of FIG. 5A.

DETAILED DESCRIPTION OF NON-LIMITING EXAMPLE EMBODIMENTS

Figure 1:
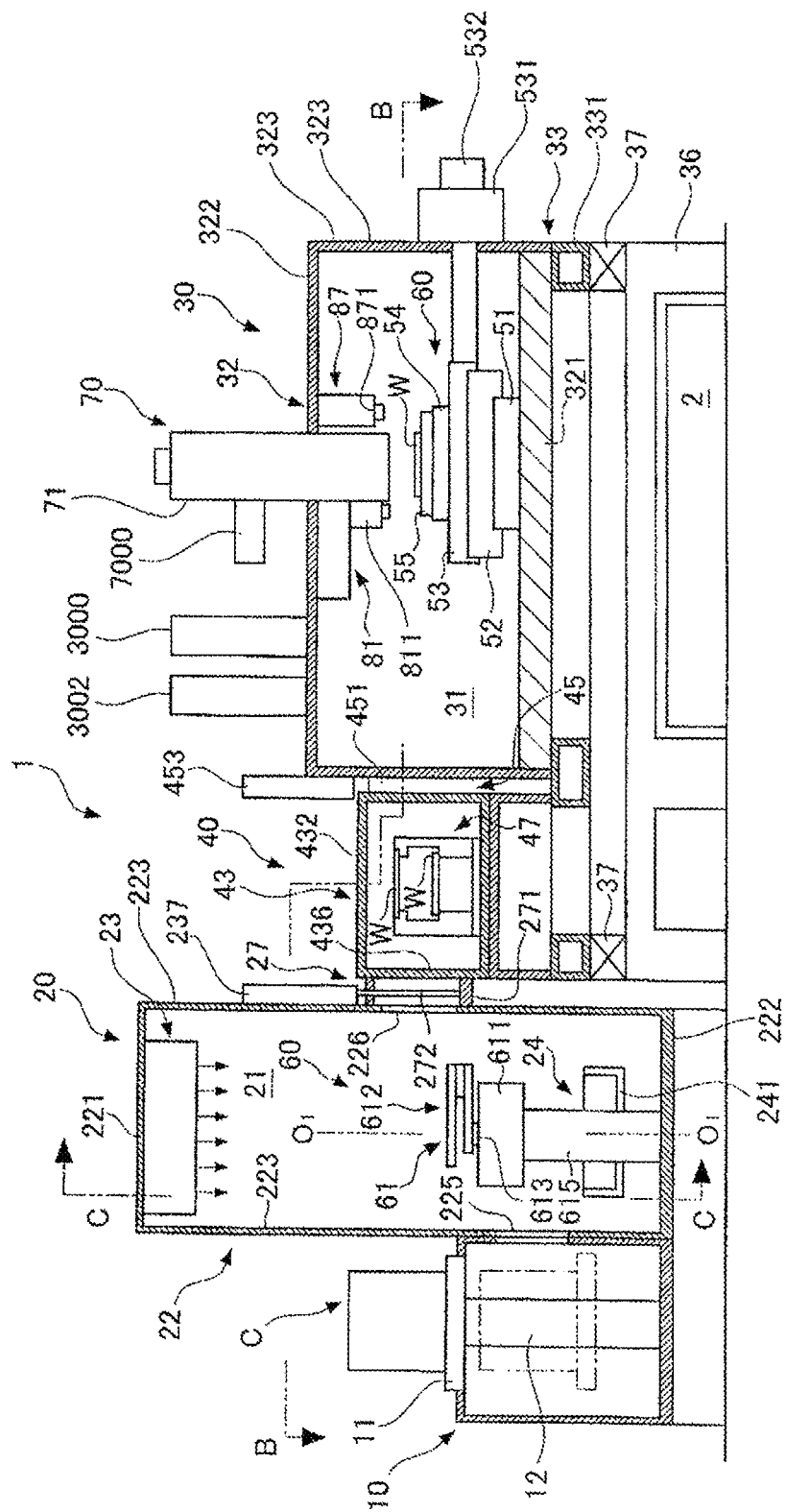
FIG. 1 is an elevational view showing main configuration components in an inspection apparatus according to an embodiment taken along line A-A of FIG. 2.

An inspection apparatus includes beam generation means that generates any of charged particles and electromagnetic waves as a beam, a primary optical system that irradiates an inspection object held in a working chamber with the beam, a secondary optical system that detects secondary charged particles occurring from the inspection object and an image processing system that forms an image on the basis of the detected secondary charged particles, in which irradiation energy of the beam is set in an energy region where mirror electrons are emitted as the secondary charged particles from the inspection object due to the beam irradiation, the secondary optical system includes a camera for detecting the secondary charged particles, a numerical aperture whose position is adjustable along an optical axis direction and a lens that forms an image of the secondary charged particles that have passed through the numerical aperture on an image surface of the camera, and in the image processing system, the image is formed under an aperture imaging condition where the position of the numerical aperture is located on an object surface to acquire an image.

Accordingly, when the inspection object is irradiated with the beam, the mirror electrons are emitted from the inspection object. Because a height at which the mirror electrons are reflected changes depending on the state of irregularities in the surface of the inspection object, a difference in contrast is created. Also, the mirror electrons differ in orbit from the secondarily released electrons. In such a situation, the image is formed under an imaging condition (aperture imaging condition) where the position of the numerical aperture is located on the object surface to acquire an image: a crossover of the mirror electrons is aligned with the center of the numerical aperture. This can allow an inspection of irregularities in the surface of an inspection object with high contrast.

Also, in the inspection apparatus, the secondary optical system may include focus adjustment means that adjusts a focus under the aperture imaging condition.

Accordingly, the focus is adjusted under the aperture imaging condition. For example, if the focus is moved toward a minus direction, foreign matters in the surface of the inspection object come to be seen in the black color. Conversely, if the focus is moved toward a plus direction, foreign matters in the surface of the inspection object come to be seen in the white color. Thus, the inspection of irregularities in a surface of an inspection object can be provided with high contrast.

Also, in the inspection apparatus, the primary optical system may include incident angle control means that controls an incident angle of the beam with which the inspection object is irradiated.

This controls the incident angle of the beam with which the inspection object is irradiated. For example, the incident angle of the beam with which the inspection object is irradiated is controlled to be made normal. Thus, the inspection of irregularities in a surface of an inspection object can be provided with high contrast and small foreign matters (for example, foreign matters of 30 nm in size) can be detected.

Also, in the inspection apparatus, the image processing system may include shading correction means that provides a shading correction that uses a correcting white image and a correcting black image to an image formed under the aperture imaging condition, and the correcting white image may be created by adding a predetermined gradation value to the image and the correcting black image may be created by subtracting a predetermined gradation value from the image.

Accordingly, the shading correction that uses the correcting white image and the correcting black image is provided to the image formed under the aperture imaging condition. In such a situation, the correcting white image is created by adding the predetermined gradation value (for example, 40 gradations) to the image and the correcting black image is created by subtracting the predetermined gradation value (for example, 40 gradations) from the image. A width between the gradation values of the correcting white image and the correcting black image is made small, so that irregularities (defects) of the inspection object can be emphasized. Therefore, smaller foreign matters (for example, foreign matters of 20 nm in size) can be detected.

The inspection of irregularities in a surface of an inspection object can be provided with high contrast.

EMBODIMENTS

Referring to the drawings, embodiments will hereinafter be described on a semiconductor inspection apparatus that inspects a substrate, or a wafer, on which a pattern is formed, as an inspection object. Note that the following embodiments are examples of an inspection apparatus and an inspection method.

Figure 2A:
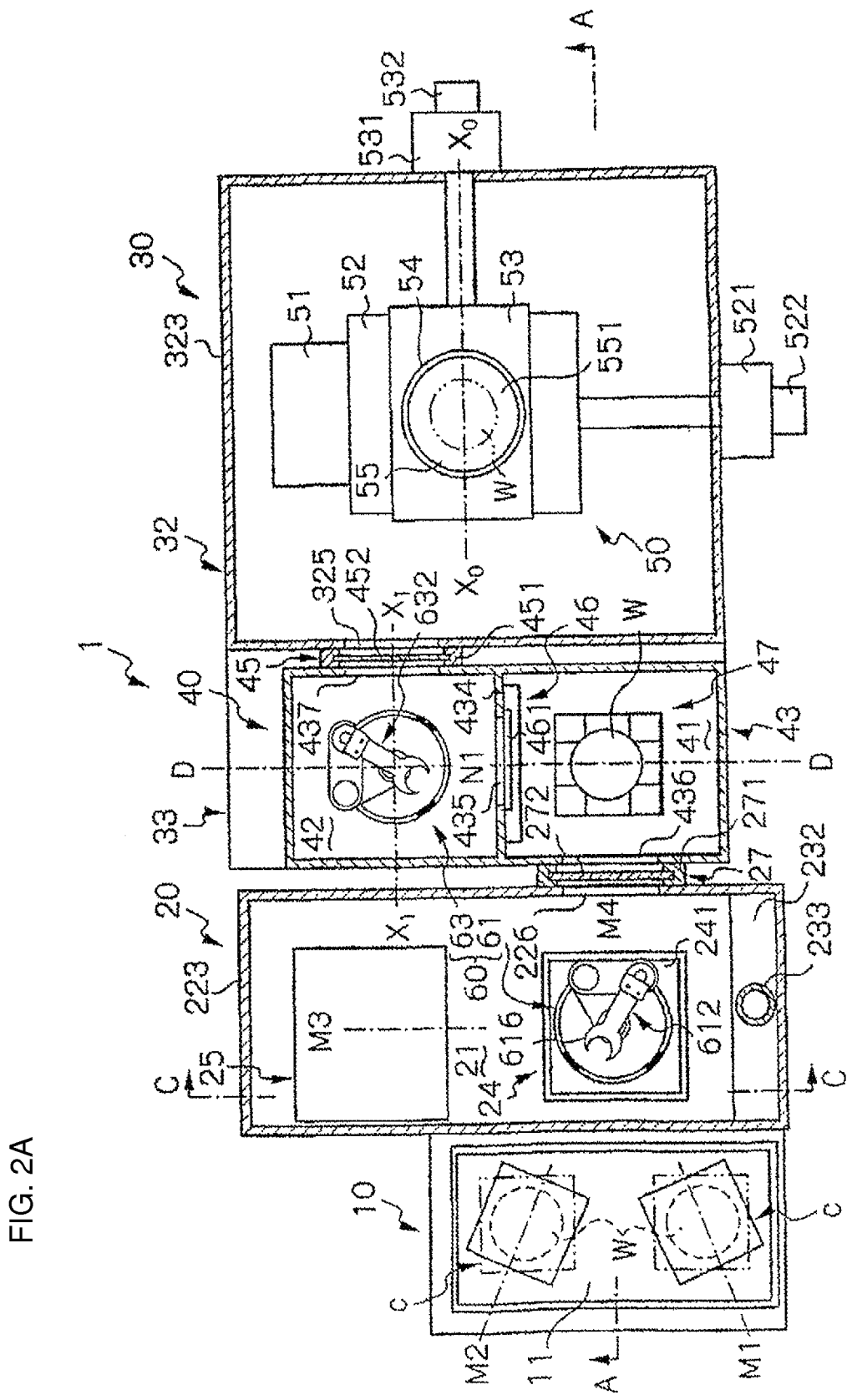
FIG. 2A is a plan view of the main configuration components of the inspection apparatus shown in FIG. 1 taken along line B-B of FIG. 1.

FIGS. 1 and 2A respectively show an elevational view and a plan view of main configuration components of a semiconductor inspection apparatus 1 of this embodiment.

The semiconductor inspection apparatus 1 of this embodiment includes: a cassette holder 10 that holds a cassette storing multiple wafers; a mini-environment device 20; a main housing 30 that defines a working chamber; a loader housing 40 that is disposed between the mini-environment device 20 and the main housing 30 to define two loading chambers; a loader 60 that loads a wafer from the cassette holder 10 onto a stage device 50 disposed in the main housing 30; an electronic optical device 70 attached to a vacuum housing; an optical microscope 3000; and a scanning electron microscope (SEM) 3002. These components are disposed in a positional relationship as shown in FIGS. 1 and 2A. The semiconductor inspection apparatus 1 further includes: a precharge unit 81 disposed in the vacuum main housing 30; a potential application mechanism 83 (shown in FIG. 14) that applies a potential to a wafer; an electron beam calibration mechanism 85; and an optical microscope 871 that configures an alignment controller 87 for positioning the wafer on the stage device. The electronic optical device 70 includes a lens tube 71 and a light source tube 7000. The internal configuration of the electronic optical device 70 will be described later.

Cassette Holder

The cassette holder 10 holds a plurality of (two in this embodiment) cassettes c (e.g., closed cassettes, such as SMIF and FOUP, made by Asyst technologies Inc.) each of which stores a plurality of (e.g., 25) wafers in a state of being arranged in the vertical direction in horizontal orientation. In the case of conveying the cassette by a robot or the like and automatically loading the cassette to the cassette holder 10, a cassette holder suitable to this loading manner is adopted. In the case of manual loading, a cassette holder that has an open cassette structure suitable to this loading manner is adopted. Any of the holders can be selected and installed. In this embodiment, the cassette holder 10 is in conformity with a system of automatically loading the cassette c, and includes, for instance, a lifting table 11, and a lifting mechanism 12 that vertically lifts and lowers the lifting table 11. The cassette c can be automatically set onto the lifting table in a state indicated by a chain line in FIG. 2A. After the setting, the cassette is automatically turned to a state indicated by a solid line in FIG. 2A to be aligned with the turning axis of a first conveyance unit in the mini-environment device. The lifting table 11 is lowered to a state indicated by a chain line in FIG. 1. Thus, the cassette holder used in the case of automatic loading or the cassette holder used in the case of manual loading may be appropriately selected among cassettes having publicly known structures. Accordingly, detailed description on the structure and functions of the cassette holder is omitted.

Figure 2B:
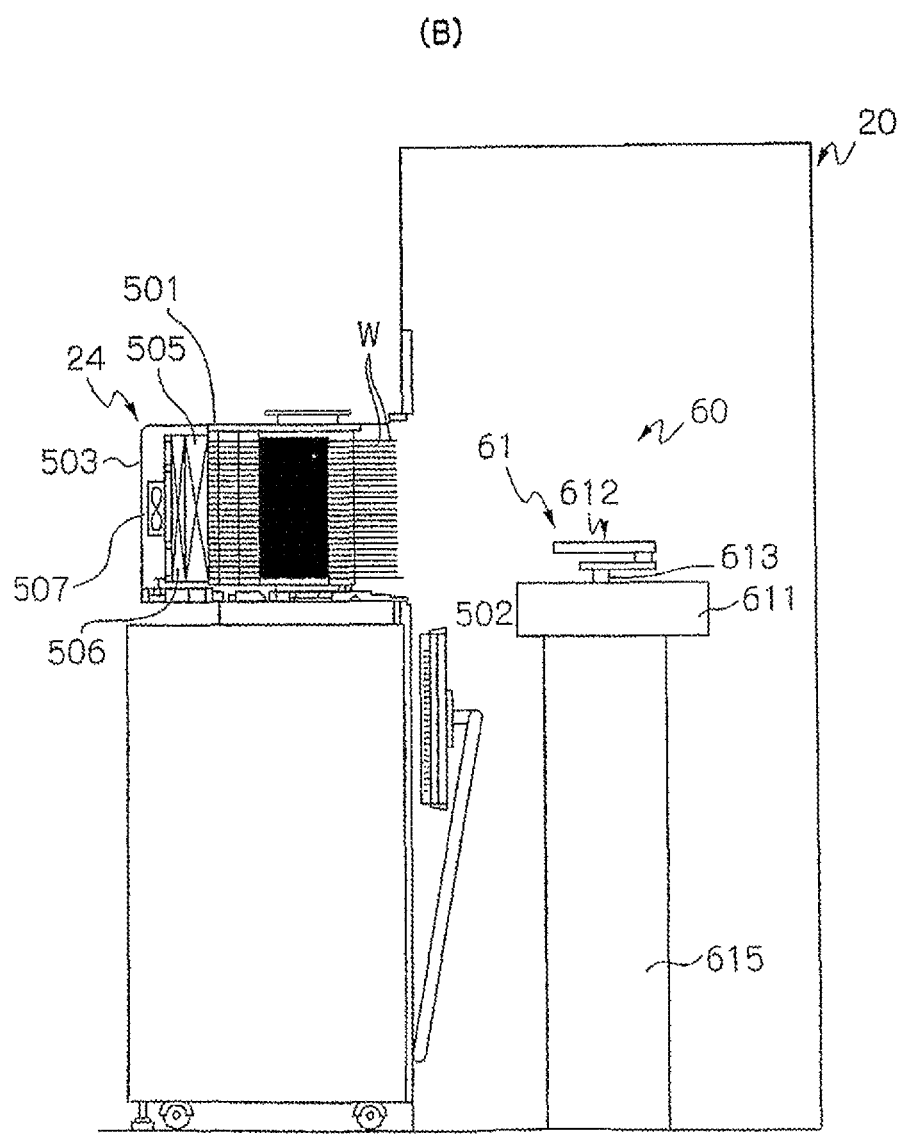
FIG. 2B is a schematic sectional view showing another embodiment of a substrate installation device of the inspection apparatus of the embodiment.

In another embodiment, as shown in FIG. 2B, a plurality of 300 mm substrates are stored in groove pockets (not shown) fixed in a box main body 501 in a state of being accommodated, and then conveyed or stored. The substrate conveyance box 24 includes: a box main body 501 having a shape of a rectangular cylinder; a substrate conveyance door 502 that is connected to the box main body 501 and a device of automatically opening and closing the substrate conveyance door and can mechanically open and close an opening on a side of the box main body 501; a cover 503 that is disposed opposite to the opening and covers the opening through which filters and a fan motor is attached and detached; groove pockets (not shown) for storing substrates W; an ULPA filter 505; a chemical filter 506; and a fan motor 507. In this embodiment, the substrate is carried in and out by a robotic first conveyance unit 612 of the loader 60.

The substrates, or wafers, stored in the cassette c are to be inspected. The inspection is performed after or in a process on a wafer, in semiconductor manufacturing processes. More specifically, substrates, which are wafers, subjected to a film forming process, CMP, ion injection, etc., wafers on which wiring patterns are formed, or wafers on which wiring patterns have not been formed yet, are stored in the cassette. The wafers stored in the cassette c are arranged vertically separated and in parallel with each other. Accordingly, an arm of the after-mentioned first conveyance unit is configured to be vertically moved so as to hold the wafer at any position by the first conveyance unit.

Mini-Environment Apparatus

Figure 3:
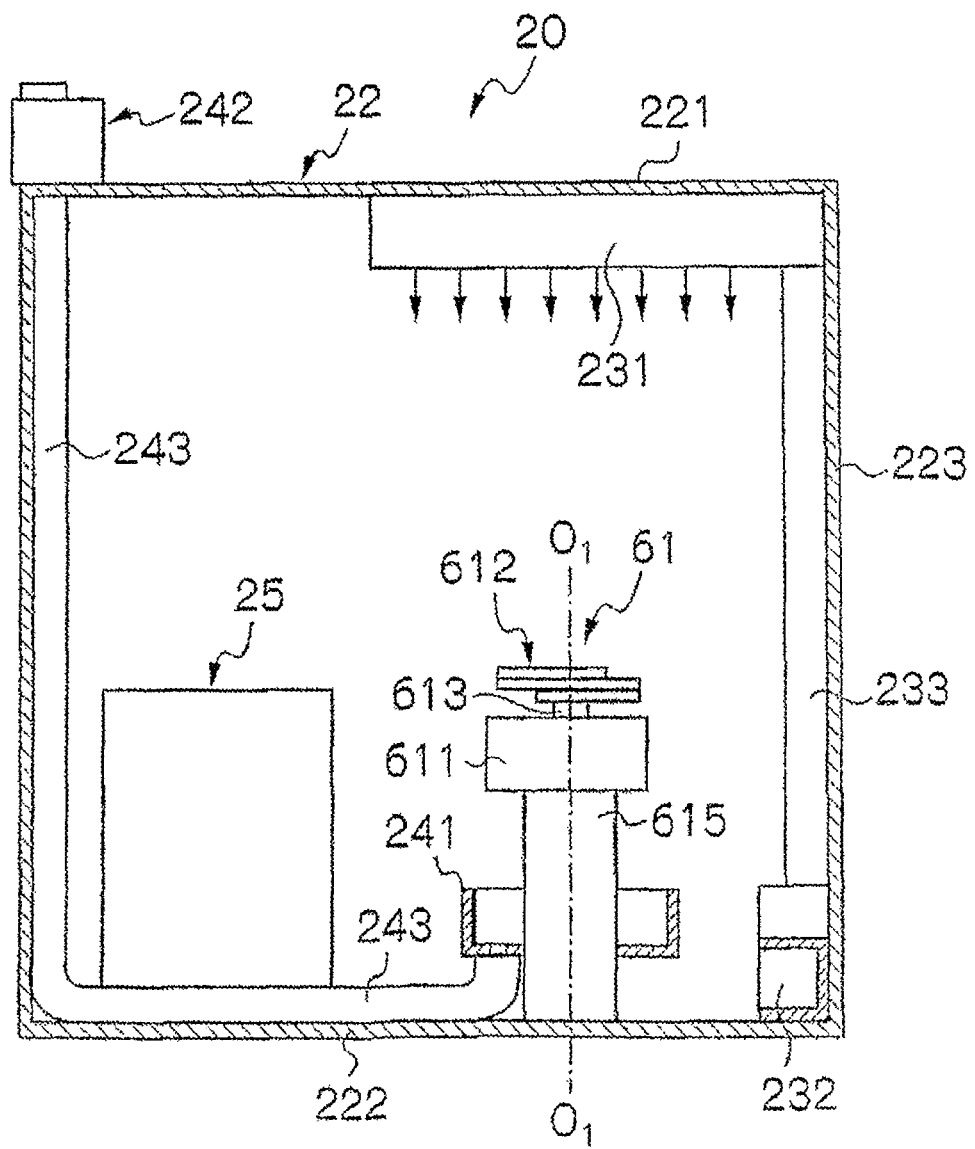
FIG. 3 is a sectional view showing a mini-environment device of FIG. 1 taken along line C-C.

In FIGS. 1 to 3, the mini-environment device 20 includes: a housing 22 that defines an atmosphere-controlled mini-environment space 21; a gas circulator 23 that circulates gas, such as cleaned air, to control an atmosphere in the mini-environment space 21; an evacuator 24 that collects and evacuates a part of air supplied in the mini-environment space 21; and a prealigner 25 that is disposed in the mini-environment space 21 and roughly positions a substrate as an inspection object, i.e., a wafer.

The housing 22 includes a top wall 221, a bottom wall 222, and surrounding walls 223 that surround the periphery, and thus has a structure that isolates the mini-environment space 21 from the outside. As shown in FIG. 3, in order to control the atmosphere in the mini-environment space, the gas circulator 23 includes: a gas supply unit 231 that is attached to the top wall 221 in the mini-environment space 21, cleans the gas (air in this embodiment), and flows the cleaned air as a laminar flow directly downward through one or more gas outlet (not shown); a collection duct 232 that is disposed on the bottom wall 222 in the mini-environment space, and collects the air having flown down toward the bottom; and a pipe 233 that communicates with the collection duct 232 and the gas supply unit 231, and returns the collected air to the gas supply unit 231. In this embodiment, the gas supply unit 231 captures about 20% of the air to be supplied, from the outside of the housing 22 and cleans the captured air. However, the ratio of the air captured from the outside is arbitrarily selected. The gas supply unit 231 includes a HEPA or ULPA filter that has a publicly known structure for creating cleaned air. The downward laminar flow of the cleaned air, i.e., the downflow, is supplied mainly so as to flow over a conveyance surface of the after-mentioned first conveyance unit disposed in the mini-environment space 21. The flow prevents dust that may possibly be caused by the conveyance unit from adhering to the wafer. Accordingly, the downflow nozzle is not necessarily disposed at a position near the top wall as shown in the figure. The nozzle may be disposed at any position above the conveyance surface of the conveyance unit. The air is not necessarily flown over the entire surface of the mini-environment space. In some cases, an ion wind is used as the cleaned air to secure cleanness. A sensor for observing the cleanness may be provided in the mini-environment space, and the apparatus can be shut down when the cleanness is degraded. A gateway 225 is formed at a portion of the surrounding wall 223 of the housing 22 that is adjacent to the cassette holder 10. A shutter device having a publicly known structure may be provided adjacent to the gateway 225 to shut the gateway 225 from a side of the mini-environment device. The downflow of the laminar flow formed adjacent to the wafer may have, for instance, a flow rate of 0.3 to 0.4 m/sec. The gas supply unit may be provided outside of the mini-environment space, instead of the inside of this space.

The evacuator 24 includes: an intake duct 241 disposed at a position below a wafer conveyance surface of the conveyance unit, at a lower part of the conveyance unit; a blower 242 disposed outside of the housing 22; and a pipe 243 that communicates with the intake duct 241 and the blower 242. The evacuator 24 sucks, into intake duct 241, the gas that flows around the conveyance unit and may contain dust that may possibly be caused by the conveyance unit, and evacuates the gas out of the housing 22 through the pipes 243 and 244 and the blower 242. In this case, the gas may be evacuated into an exhaust pipe (not shown) drawn adjacent to the housing 22.

The aligner 25 disposed in the mini-environment space 21 optically or mechanically detects an orientation flat (a flat part formed at the circumference of the circular wafer) formed at the wafer or one or more V-shaped notches formed at the circumference of the wafer, and preliminarily positions the wafer in the turning direction about the axis O-O of the wafer at an accuracy of about ±1 degree. The prealigner configures a part of a mechanism of determining the coordinates of an inspection object, and functions to roughly position the inspection object. The prealigner itself may be a prealigner having a publicly known structure. Accordingly, description on the structure and operations is omitted.

Although not shown, a collection duct for the evacuator may be provided also at the lower part of the prealigner to evacuate air including dust ejected from the prealigner to the outside.

Main Housing

In FIGS. 1 and 2A, the main housing 30, which defines a working chamber 31, includes a housing main body 32. The housing main body 32 is supported by a housing supporter 33 mounted on a vibration isolating device, or a vibration isolator 37, disposed on a base frame 36. The housing supporter 33 includes a frame structure 331 configured into a rectangular shape. The housing main body 32, which is disposed and fixed onto the frame structure 331, includes a bottom wall 321 mounted on the frame structure, a top wall 322, surrounding walls 323 that are connected to the bottom wall 321 and the top wall 322 and surround the periphery, and isolates the working chamber 31 from the outside. In this embodiment, the bottom wall 321 is made of steel plates having a relatively large thickness not to cause distortion due to the weight of a device, such as a stage device, mounted on this wall. However, the bottom wall may have another structure. In this embodiment, the housing main body and the housing supporter 33 are configured to have rigid structures. The configuration allows the vibration isolator 37 to prevent vibrations of a floor on which the base frame 36 is installed from being transferred to the rigid structures. A gateway 325 through which a wafer is carried in and out is formed at a surrounding wall adjacent to the after-mentioned loader housing among the surrounding walls 323 of the housing main body 32.

The vibration isolator may be an active isolator having an air spring, a magnetic bearing or the like, or a passive isolator including these components. Each of the isolators may be an isolator having a publicly known structure. Accordingly, description on the structure and operations is omitted. The atmosphere in the working chamber 31 is kept in a vacuum atmosphere by a vacuum device (not shown) having a publicly known structure. A controller 2 that controls the operations of the entire apparatus is disposed at the bottom of the base frame 36.

Loader Housing

Figure 4:
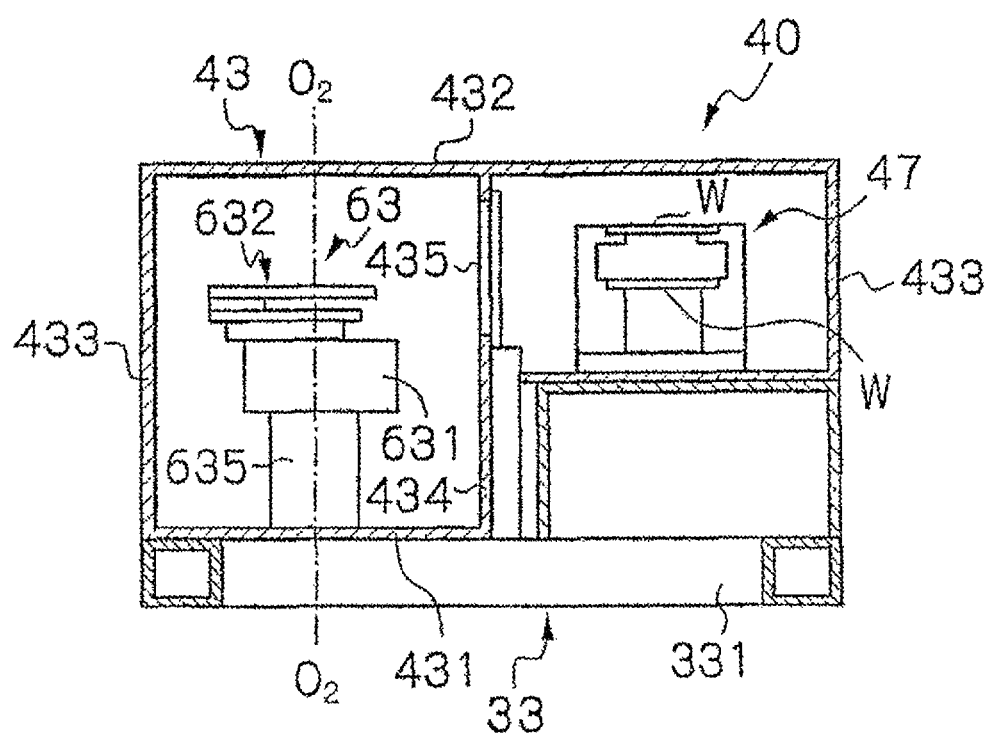
FIG. 4 is a diagram showing a loader housing of FIG. 1 taken along line D-D of FIG. 2.

In FIGS. 1, 2A and 4, the loader housing 40 includes a housing main body 43 that defines a first loading chamber 41 and a second loading chamber 42. The housing main body 43 includes a bottom wall 431, a top wall 432, surrounding walls 433 that surround the periphery, and a partition wall 434 that separates the first loading chamber 41 and the second loading chamber 42 from each other. The structure can separate both the loading chambers from the outside. An opening, or a gateway 435, through which a wafer is exchanged between both the loading chambers is formed at the partition wall 434. Gateways 436 and 437 are formed at portions of the surrounding walls 433 adjacent to the mini-environment device and the main housing. The housing main body 43 of the loader housing 40 is mounted on the frame structure 331 of the housing supporter 33, and supported by this structure. Accordingly, vibrations of the floor are not transmitted to loader housing 40 either. The gateway 436 of the loader housing 40 and the gateway 226 of the housing 22 of the mini-environment device match with each other. A shutter device 27 that selectively blocks communication between the mini-environment space 21 and the first loading chamber 41 is provided at the matching portion. The shutter device 27 includes: a seal member 271 that surrounds the gateways 226 and 436 and is in close contact with and fixed to the side wall 433; a door 272 cooperates with the seal member 271 to prevent the air from flowing through the gateways; and a drive device 273 that moves the door. The gateway 437 of the loader housing 40 and the gateway 325 of the housing main body 32 match with each other. A shutter device 45 is provided that selectively blocks communication between the second loading chamber 42 and the working chamber 31. The shutter device 45 includes: a seal member 451 that surrounds the gateways 437 and 325 and is in close contact with and fixed to the respective side walls 433 and 323; a door 452 that cooperates with seal member 451 to block communication of air through the gateways; and a drive device 453 that moves the door. Furthermore, a shutter device 46 that closes the door 461 to selectively seal and block communication between the first and second loading chambers is provided at an opening formed at the partition wall 434. In closed states, the shutter devices 27, 45 and 46 can hermetically seal the corresponding chambers. These shutter devices may be devices having a publicly known structure. Accordingly, detailed description on the structure and operations is omitted. The method of supporting the housing 22 of the mini-environment device 20 is different from the method of supporting the loader housing. In order to prevent vibrations of the floor from being transmitted to the loader housing 40 and the main housing 30 through the mini-environment device, a vibration isolating cushion member is preferably disposed between the housing 22 and the loader housing 40 so as to hermetically surround the gateway.

Figure 5A:
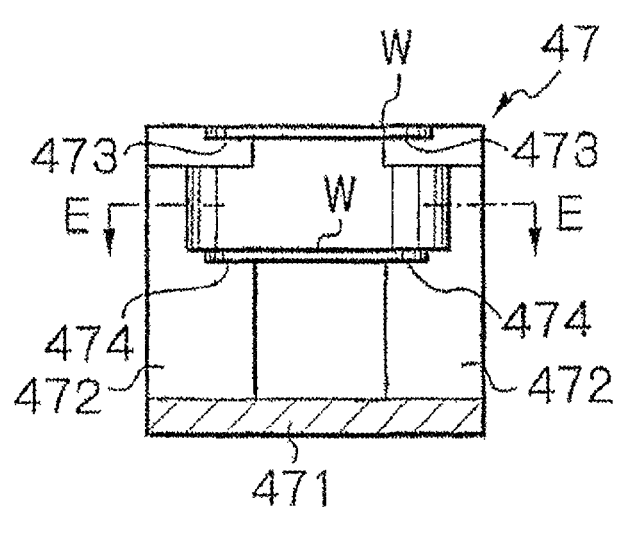
FIGS. 5A and 5B are enlarged views of a wafer rack.
Figure 5B:
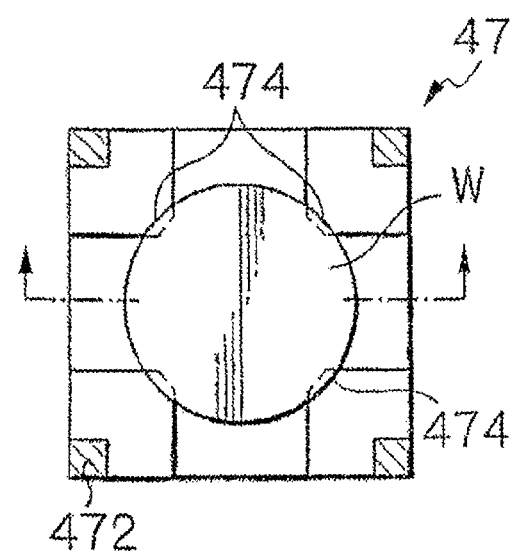

A wafer rack 47 that vertically separates a plurality of (two in this embodiment) wafers and horizontally supports the wafers is arranged in the first loading chamber 41. As shown in FIGS. 5A and 5B, the wafer rack 47 includes pillars 472 fixed in a manner of being separated at the four corners of a rectangular substrate 471 in a state of standing upright. Two stages of supporters 473 and 474 are formed at each pillar 472. The periphery of the wafer W is mounted on the supporters, and thus the wafer is held. The distal ends of the arms of the after-mentioned first and second conveyance units are moved to approach the wafers between the adjacent pillars, and the arms hold the wafers.

The atmospheres of the loading chambers 41 and 42 can be controlled to a high vacuum (a degree of vacuum of $10^{-5}$ to $10^{-5}$ Pa) by a vacuum evacuator (not shown) that has a publicly known structure including a vacuum pump (not shown). In this case, the first loading chamber 41 may be kept in a low vacuum atmosphere and serve as a low vacuum chamber, and the second loading chamber 42 may be kept in a high vacuum atmosphere and serve as a high vacuum chamber. This structure can efficiently prevent wafer from being contaminated. Adoption of the structure can convey a wafer that is stored in the loading chamber and to be subjected to defect inspection at the next time, into the working chamber without delay. Adoption of such a loading chamber can improve the throughput of defect inspection, and achieve a degree of vacuum as high as possible around an electron source, which is required to be stored in a high vacuum state.

A vacuum exhaust pipe and a vent pipe for inert gas (e.g., dry pure nitrogen) (both the pipes are not shown) communicate to first and second loading chambers 41 and 42, respectively. According to this configuration, an atmospheric pressure state in each loading chamber can be achieved by the inert gas vent (inert gas is injected to prevent oxygen gas etc. other than inert gas from adhering to the surface). The device for such inert gas venting may be a device having a publicly known structure. Accordingly, the detailed description is omitted.

Stage Device

The stage device 50 includes: a fixed table 51 disposed on the bottom wall 321 of the main housing 30; a Y table 52 that moves in the Y direction (the direction perpendicular to the sheet of FIG. 1) on the fixed table; an X table 53 that moves in the X direction (the lateral direction in FIG. 1) on the Y table; a turn table 54 that can turn on the X table; and a holder 55 disposed on the turn table 54. A wafer is releasably held on a wafer-mounting surface 551 of the holder 55. The holder may be a holder that has a publicly known structure and can releasably grip a wafer mechanically or according to an electrostatic chuck system. The stage device 50 can highly accurately position a wafer held by the holder on the mounting surface 551, in the X direction, Y direction and the Z direction (the vertical direction in FIG. 1), and further in a direction (θ direction) about an axis perpendicular to the wafer holding surface, with respect to an electron beam emitted from the electronic optical device, by moving the tables using servomotors, encoders and various sensors (not shown). As to the positioning in the Z direction, for instance, the position of the mounting surface on the holder may preferably be slightly adjusted in the Z direction. In this case, the reference position of the mounting surface is detected by a position measuring instrument using fine diameter laser (a laser interferometric distance meter adopting the principle of an interferometer), and the position is controlled by a feedback circuit, not shown. Together with or instead of this control, the position of the notch or the orientation flat of the wafer is measured to detect the planar position and the turning position of the wafer with respect to the electron beam, and the positions are controlled by turning the turn table by a stepping motor or the like capable of fine angle control. In order to prevent dust from occurring in the working chamber as much as possible, servomotors 521 and 531 and encoders 522 and 532 for the stage device are disposed out of the main housing 30. The stage device 50 may be, for instance, a device used in a stepper or the like having a publicly known structure. Accordingly, detailed description on the structure and operations is omitted. The laser interferometric distance meter may be a meter having a publicly known structure. Accordingly, detailed description on the structure and operations is omitted.

The wafer turning position and the X and Y positions with respect to the electron beam are preliminarily input into an after-mentioned signal detection system or an image processing system to allow the signal to be standardized. Furthermore, a wafer chuck mechanism provided in the holder can apply a voltage for chucking a wafer to an electrode of an electrostatic chuck, and press three points on the circumference of the wafer (the points preferably separated by regular intervals in the circumferential direction) for positioning. The wafer chuck mechanism includes two fixed positioning pins, and one pressing crank pin. The clamp pin can achieve automatic chucking and automatic releasing, and configures a conduct part for voltage application.

In this embodiment, the table moving in the lateral direction in FIG. 2A is the X table, and the table moving in the vertical direction is the Y table. Instead, the table moving in the lateral direction may be the Y table, and the table moving in the vertical direction may be the X table in this diagram.

Loader

The loader 60 includes: a robotic first conveyance unit 61 disposed in the housing 22 of the mini-environment device 20; and a robotic second conveyance unit 63 disposed in the second loading chamber 42.

The first conveyance unit 61 includes a multi-axial arm 612 capable of turning about an axis $O_1$-$O_1$ with respect to a driver 611. The multi-axial arm may be an arm having any configuration. In this embodiment, the arm includes three parts attached in a manner capable of turning with respect to each other. A part of the arm 612 of the first conveyance unit 61, i.e., a first part nearest the driver 611, is attached to a shaft 613 that can be turned by a drive mechanism (not shown) that has a publicly known structure and provided in the driver 611. The arm 612 can be turned about the axis $O_1$-$O_1$ by the shaft 613, and extend and contract in the radial direction with respect to the axis $O_1$-$O_1$ as a whole by relative turning between the components. A distal end of a third part of the arm 612 that is most opposite to the shaft 613 is provided with a grip device 616 that has a publicly known structure, such as a mechanical chuck or electrostatic chuck, and grips a wafer. The driver 611 can be vertically moved by a lifting mechanism 615 having a publicly known structure.

The first conveyance unit 61 extends the arm 612 toward any one of directions M1 and M2 of the two cassettes c held by the cassette holder, mounts one wafer stored in the cassette c on the arm or grips the wafer using a chuck (not shown) attached to the distal end of the arm, and picks up the wafer. Subsequently, the arm is contracted (a state shown in FIG. 2A), turns to a position allowing the arm to extend in a direction M3 of the prealigner 25, and stops at this position. The arm then extends again, and mounts the wafer held by the arm on the prealigner 25. After the wafer is received from the prealigner in a manner inverted from the above description, the arm further turns and stops at a position allowing the arm to extend toward the second loading chamber 41 (direction M4), and exchanges the wafer with the wafer rack 47 in the second loading chamber 41. In the case of mechanically gripping the wafer, the peripheral portion of the wafer (a range within about 5 mm from the periphery) is grasped. This gripping manner is adopted because a device (circuit wiring) is formed on the entire surface except for the peripheral part of the wafer and gripping of this portion breaks the device and causes a defect.

The second conveyance unit 63 has a structure basically identical to the structure of the first conveyance unit. The structure is different only in that the wafer is conveyed between the wafer rack 47 and the mounting surface of the stage device. Accordingly, the detailed description is omitted.

In the loader 60, the first and second conveyance units 61 and 63 convey a wafer from the cassette held in the cassette holder onto the stage device 50 disposed in the working chamber 31 and convey a wafer in the inverse direction, in a state where the wafer is maintained in a horizontal orientation. The arm of the conveyance unit vertically moves only in the cases where the wafer is picked up from and inserted into the cassette, the wafer is mounted on and picked up from the wafer rack, and the wafer is mounted on and picked up from the storage device. Accordingly, even a large wafer, e.g., a wafer having a diameter of 30 cm, can be smoothly moved.

Wafer Conveyance

Next, conveyance of a wafer from the cassette c supported by the cassette holder to the stage device 50 disposed in the working chamber 31 will be sequentially described.

In the case of manually setting the cassette, the cassette holder 10 may be a holder having a structure suitable to the setting manner. In the case of automatically setting the cassette, the cassette holder 10 may be a holder having a structure suitable to the setting manner. In this embodiment, after the cassette c is set on the lifting table 11 of the cassette holder 10, the lifting table 11 is lowered by the lifting mechanism 12 to match the cassette c with the gateway 225.

After the cassette matches with the gateway 225, a cover (not shown) provided on the cassette opens. Furthermore, a cylindrical cover is disposed between the cassette c and the gateway 225 of the mini-environment. The configuration isolates the insides of the cassette and the mini-environment space from the outside. These structures are publicly known. Accordingly, detailed description on the structures and operations is omitted. In the case where a shutter device that opens and closes the gateway 225 is provided on the mini-environment device 20, the shutter device operates to open the gateway 225.

Meanwhile, the arm 612 of the first conveyance unit 61 stops in any of states of orientations in the directions M1 and M2 (the direction M1 in this direction). After the gateway 225 opens, the arm extends and receives one of the wafers stored in the cassette at the distal end of the arm. The vertical positions of the arm and the wafer to be picked up from the cassette are adjusted by vertically moving the driver 611 and the arm 612 of the first conveyance unit 61 in this embodiment. Instead, the movement may be achieved by vertically moving the lifting table of the cassette holder. Both movements may be adopted.

After the arm 612 has received the wafer, the arm is contracted. The gateway is closed by operating the shutter device (in the case with the shutter device). Next, the arm 612 comes into a state capable of extending in the direction M3 by turning about the axis $O_1$-$O_1$. The arm then extends and mounts, on the prealigner 25, the wafer mounted on the distal end of the arm or gripped by the chuck. The prealigner positions the orientation of the wafer in the turning direction (the direction about a central axis perpendicular to the wafer surface) within a prescribed range. After the positioning has been completed, the conveyance unit 61 receives the wafer from the prealigner 25 at the distal end of the arm and subsequently the arm is contracted to have an orientation allowing the arm to extend toward in the direction M4. The door 272 of the shutter device 27 then operates to open the gateways 226 and 436, the arm 612 extends to mount the wafer on the upper stage or the lower stage of the wafer rack 47 in the first loading chamber 41. As described above, before the shutter device 27 opens and the wafer is carried into the wafer rack 47, the opening 435 formed at the partition wall 434 is hermetically closed by the door 461 of the shutter device 46.

In the process of conveying the wafer by the first conveyance unit, cleaned air flows as a laminar flow (as a downflow) from the gas supply unit 231 provided on the housing of the mini-environment device. The flow prevents dust from adhering to the upper surface of the wafer during conveyance. A part of air around the conveyance unit (about 20% of air that is supplied from a supply unit and mainly dirty in this embodiment) is sucked from the intake duct 241 of the evacuator 24 and evacuated out of the housing. The remaining air is collected through the collection duct 232 provided at the bottom of the housing, and returned to the gas supply unit 231 again.

After the wafer is mounted in the wafer rack 47 in the first loading chamber 41 of the loader housing 40 by the first conveyance unit 61, the shutter device 27 is closed to seal the inside of the loading chamber 41. The inert gas is then charged in the first loading chamber 41 to evacuate the air, and subsequently the inert gas is also evacuated. The inside of the loading chamber 41 is thus in a vacuum atmosphere. The vacuum atmosphere of the first loading chamber may be a low degree of vacuum. After a certain degree of vacuum is achieved in the loading chamber 41, the shutter device 46 operates to open the gateway 434 having being hermetically closed with the door 461, the arm 632 of the second conveyance unit 63 extends, and receives one wafer from the wafer rack 47 by the grip device at the distal end (mounted on the distal end or gripped by the chuck attached to the distal end). After the wafer has been received, the arm is contracted, the shutter device 46 operates again, and the gateway 435 is closed with the door 461. Before the shutter device 46 opens, the arm 632 preliminarily becomes in an orientation capable of extending in the direction N1 toward the wafer rack 47. As described above, before the shutter device 46 opens, the gateways 437 and 325 are closed with the door 452 of the shutter device 45, communication between the insides of the second loading chamber 42 and the working chamber 31 is blocked in a hermetical state, and the inside of the second loading chamber 42 is vacuum-evacuated.

After the shutter device 46 closes the gateway 435, the inside of the second loading chamber is vacuum-evacuated again to be in a degree of vacuum higher than the degree in the first loading chamber. Meanwhile, the arm of the second conveyance unit 61 turns to a position capable of extending in the direction toward the stage device 50 in the working chamber 31. On the other hand, in the stage device in the working chamber 31, the Y table 52 moves upward in FIG. 2A to a position where the center line $X_0$-$X_0$ of the X table 53 substantially matches with the X axis $X_1$-$X_1$ crossing the turning axis $O_2$-$O_2$ of the second conveyance unit 63. The X table 53 moves to a position approaching the left-most position in FIG. 2A. The tables are thus in a waiting state. When the second loading chamber becomes a state substantially identical to a vacuum state in the working chamber, the door 452 of the shutter device 45 operates to open the gateways 437 and 325, the arm extends, and thus the distal end of the arm holding the wafer approaches the stage device in the working chamber 31. The wafer is mounted on the mounting surface 551 of the stage device 50. After the wafer has been mounted, the arm is contracted, and the shutter device 45 closes the gateways 437 and 325.

The operations of conveying the wafer in the cassette c onto the stage device has been described above. However, the wafer mounted on the stage device and in a state where the processes have been completed is returned from the stage device to the cassette c according to inverted operations with respect to the aforementioned operations. Since the multiple wafers are mounted on the wafer rack 47, a wafer can be conveyed between the cassette and the wafer rack by the first conveyance unit during conveyance of a wafer between the wafer rack and the stage device by the second conveyance unit. Accordingly, the inspection process can be efficiently performed.

More specifically, in the case where a processed wafer A and an unprocessed wafer B are on the wafer rack 47 of the second conveyance unit, (1) first, the unprocessed wafer B is moved to the stage device 50, and the process is started, and (2) during the process, the processed wafer A is moved by the arm from the stage device 50 to the wafer rack 47, and the unprocessed wafer C is picked up from the wafer rack also by the arm, positioned by the prealigner, and subsequently moved to the wafer rack 47 of the loading chamber 41.

Thus, in the wafer rack 47, during the process on the wafer B, the processed wafer A can be replaced with the unprocessed wafer C.

According to certain usage of such an apparatus performing inspection or evaluation, multiple stage devices 50 may be arranged in parallel, and the wafer may be moved from one wafer rack 47 to each apparatus, thereby allowing multiple wafers to be subjected to the same process.

Figure 6:
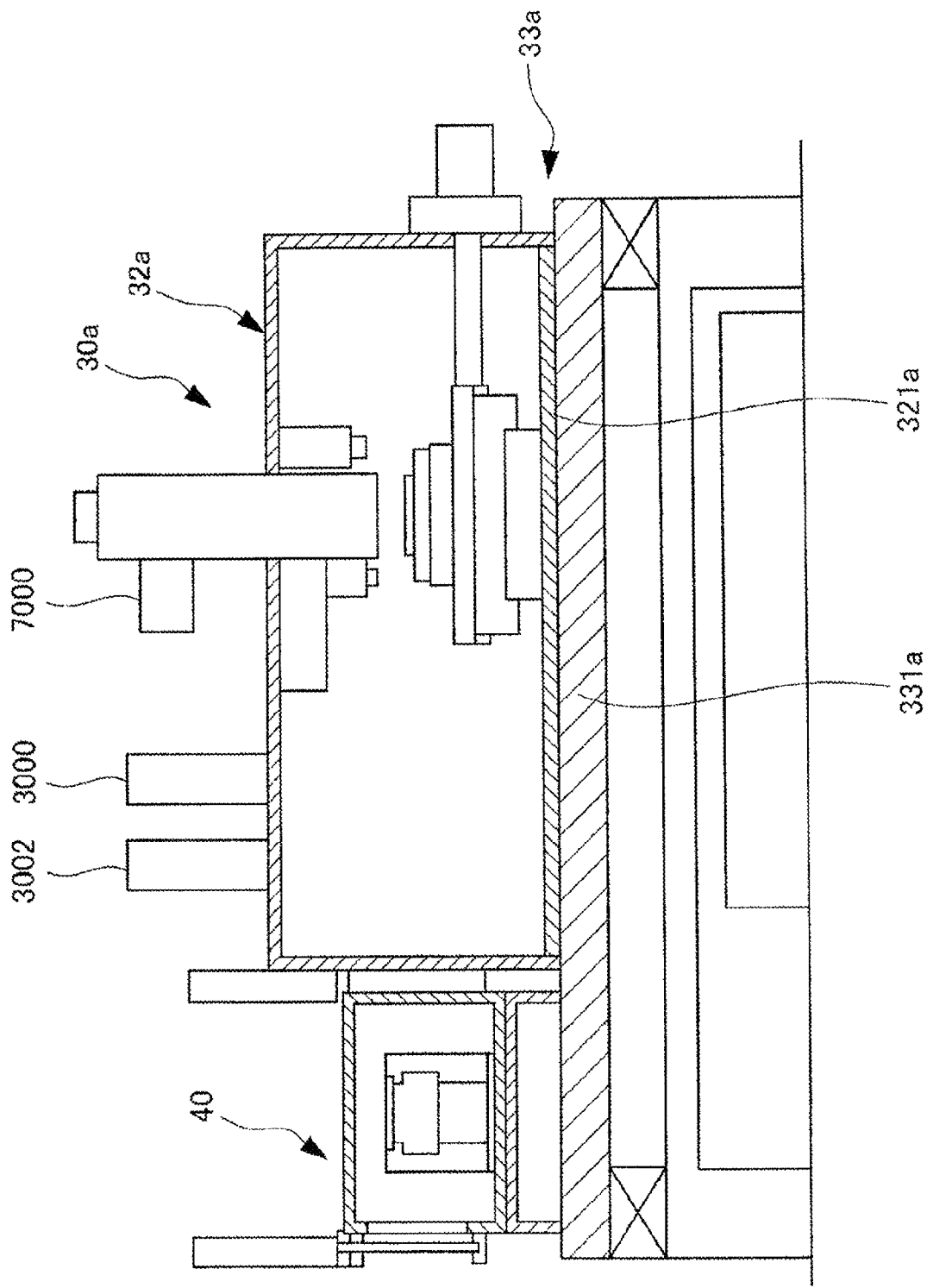
FIG. 6 is a diagram showing a variation of a method of supporting a main housing.
Figure 7:
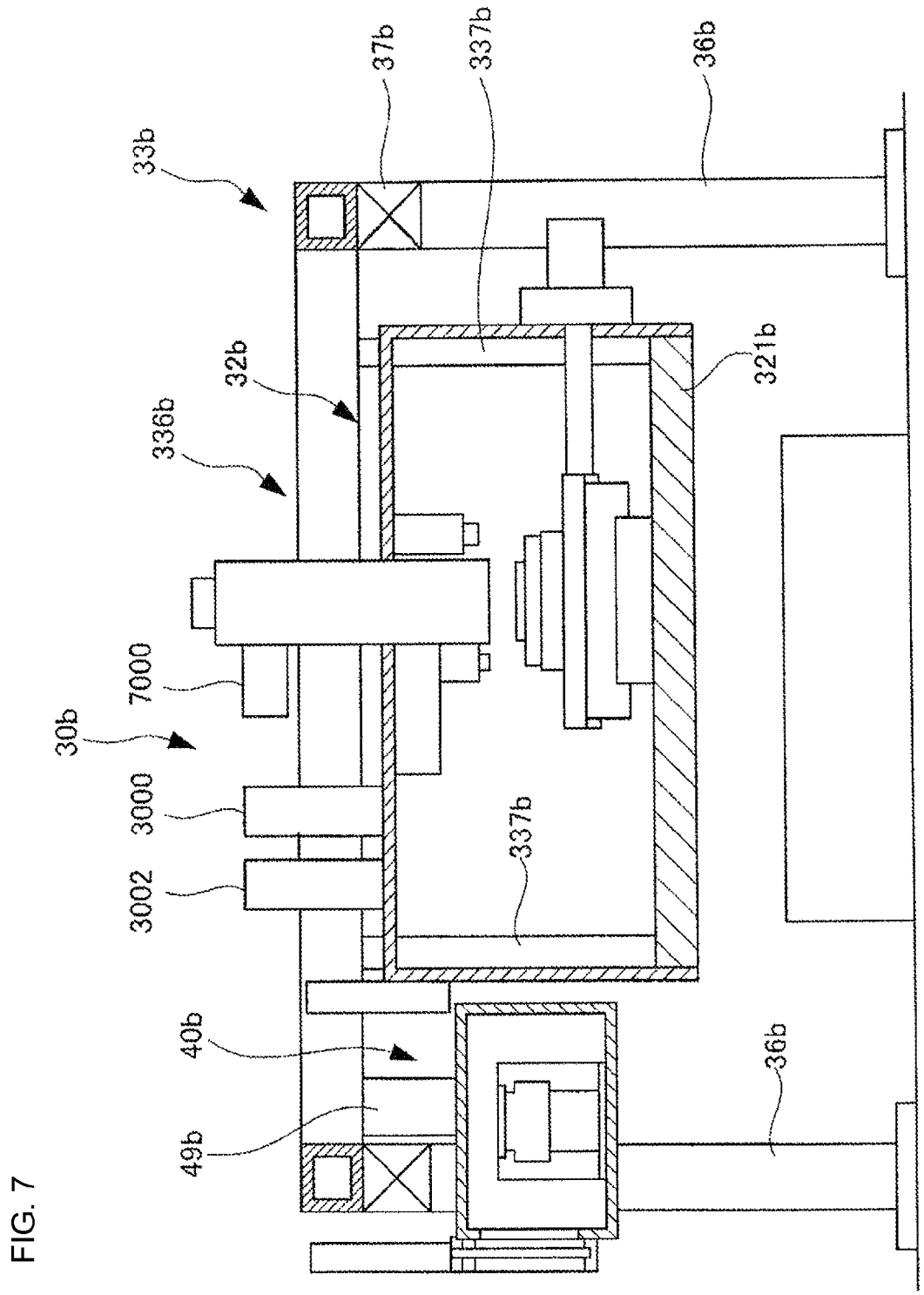
FIG. 7 is a variation of the method of supporting a main housing.

FIG. 6 shows a variation of a method of supporting a main housing. In the variation shown in FIG. 6, the housing supporter 33a includes a steel plate 331a that is thick and rectangular. A housing main body 32a is mounted on the steel plate. Accordingly, a bottom wall 321a of the housing main body 32a has a thinner structure than the bottom wall of the aforementioned embodiment. In a variation shown in FIG. 7, a housing main body 32b and a loader housing 40b are suspended and supported by a frame structure 336b of a housing supporter 33b. The bottom ends of multiple vertical frames 337b fixed to the frame structure 336b are fixed to the four corners of the bottom wall 321b of the housing main body 32b. The bottom wall supports surrounding walls and a top wall. Vibration isolators 37b are disposed between the frame structure 336b and the base frame 36b. The loader housing 40 is also suspended by a supporting member 49b fixed to the frame structure 336. In the variation of the housing main body 32b shown in FIG. 7, the support is achieved by suspension. Accordingly, in this variation, the centers of gravity of the main housing and all the devices provided in this housing can be lowered. The method of supporting the main housing and the loader housing, which includes the variations, prevents vibrations of the floor from being transmitted to the main housing and the loader housing.

In another variation, not shown, only the housing main body of the main housing may be supported by a housing supporting device from the lower side, and the loader housing may be disposed on the floor according to the same method as of the adjacent mini-environment device. In a still another variation, not shown, only the housing main body of the main housing may be supported by the frame structure in a suspending manner, and the loader housing may be disposed on the floor according to the same method as of the adjacent mini-environment device.

The embodiments can exert the following advantageous effects.

(A) The entire configuration of the mapping projection inspection apparatus that uses an electron beam can be acquired, and inspection objects can be processed at high throughput.

(B) In the mini-environment space, cleaned gas flows around the inspection object to prevent dust from adhering, and the sensors observing cleanness are provided. Thus, the inspection object can be inspected while dust in the space is monitored.

(C) The loading chamber and the working chamber are integrally supported via the vibration isolation device. Accordingly, the inspection object can be supplied to the stage device and inspected without being affected by the external environment.

Electronic Optical Device

Figure 8:
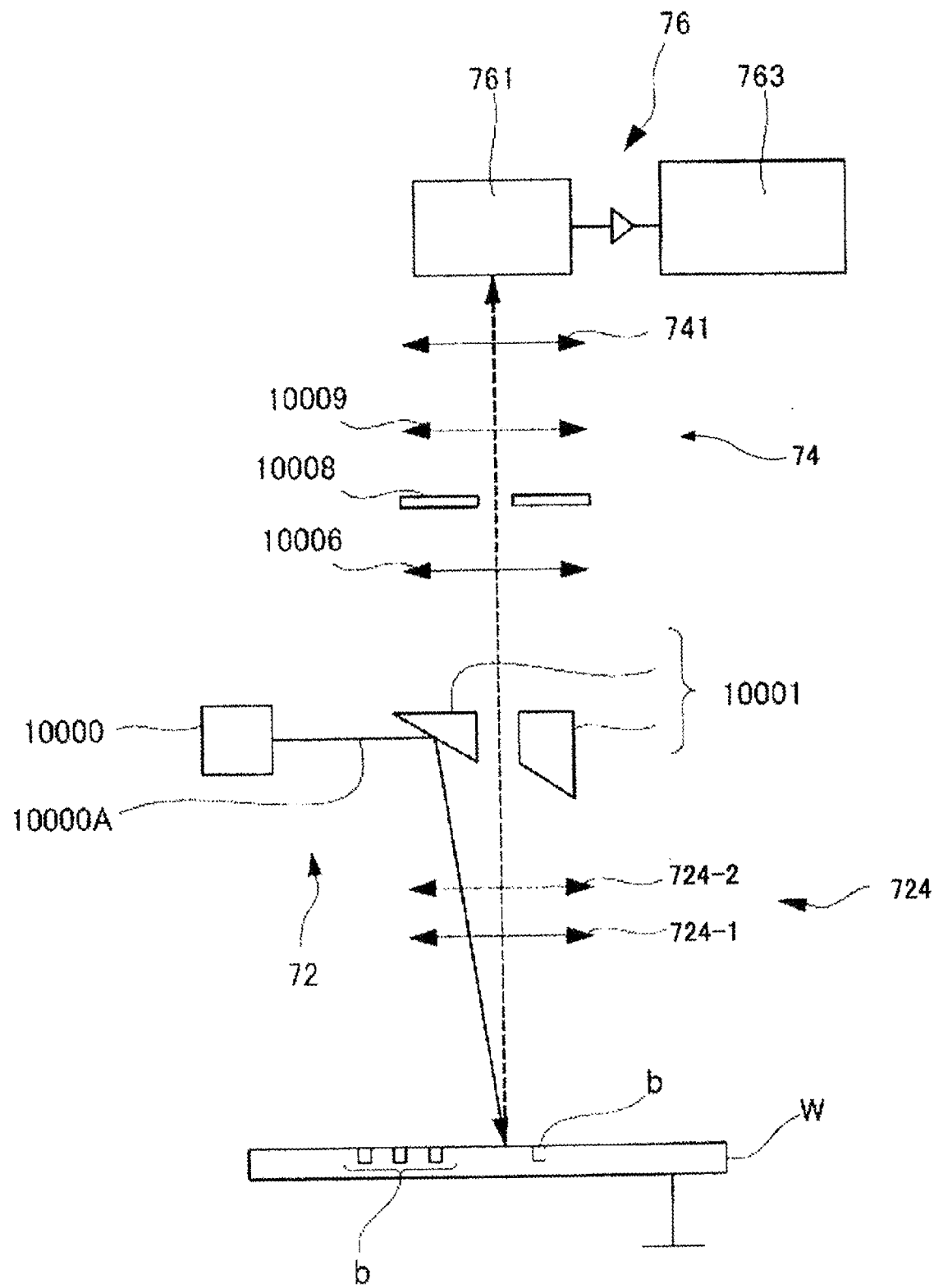
FIG. 8 is a schematic diagram showing an overview of a configuration of a light irradiation electronic optical device.

The electronic optical device 70 includes the lens tube 71 fixed to the housing main body 32. This tube internally includes: an optical system including a primary light source optical system (hereinafter, simply referred to as "primary optical system") 72 and a secondary electronic optical system (hereinafter, simply referred to as "secondary optical system") 74; and a detection system 76. FIG. 8 is a schematic diagram showing an overview of a configuration of a "light irradiation type" electronic optical device. In the electronic optical device (light irradiation electronic optical device) in FIG. 8, a primary optical system 72, which is an optical system irradiating a surface of a wafer W as an inspection object with a light beam, includes a light source 10000 that emits the light beam, and a mirror 10001 that changes the direction of the light beam. In the light irradiation electronic optical device, the optical axis of the light beam 10000A emitted from the light source is inclined from the optical axis (perpendicular to the surface of the wafer W) of photoelectrons emitted from the wafer W, which is the inspection object.

The detection system 76 includes a detector 761 disposed on an imaging surface of a lens system 741, and an image processor 763.

Light Source (Light Beam Source)

In the electronic optical device in FIG. 8, a DUV laser light source is adopted as a light source 10000. The DUV laser light source 10000 emits DUV laser light. Another light source may be adopted that allows photoelectrons to emit from a substrate irradiated with light from the light source 10000, such as UV, DUV, and EUV light and laser, X-rays and X-ray laser.

Primary Optical System

An optical system where a light beam emitted from the light source 10000 forms a primary light beam, with which a surface of the wafer W is irradiated, forming a rectangular or circular (or elliptical) beam spot, is referred to as a primary optical system. The light beam emitted from the light source 10000 passes through an objective lens optical system 724, and the light beam serves as the primary light beam with which the wafer WF on the stage device 50 is irradiated.

Secondary Optical System

A two-dimensional image of photoelectrons caused by the light beam with which the wafer W is irradiated passes through a hole formed at the mirror 10001, is formed at a field stop position by electrostatic lenses (transfer lenses) 10006 and 10009 through a numerical aperture 10008, enlarged and projected by a lens 741 thereafter, and detected by the detection system 76. The image-forming projection optical system is referred to as a secondary optical system 74.

Here, a minus bias voltage is applied to the wafer. The difference of potentials between the electrostatic lens 724 (lenses 724-1 and 724-2) and the wafer accelerates the photoelectrons caused on the surface of the sample to exert an advantageous effect of reducing chromatic aberration. An extracted electric field in the objective lens optical system 724 is 3 to 10 kV/mm, which is a high electric field. There is a relationship where increase in extracted electric field exerts advantageous effects of reducing aberrations and improving resolution. Meanwhile, increase in extracted electric field increases voltage gradient, which facilitates occurrence of evacuated. Accordingly, it is important to select and use an appropriate value of the extracted electric field. Electrons enlarged to a prescribed magnification by the lens 724 (CL) is converged by the lens (TL1) 10006, and forms a crossover (CO) on the numerical aperture 10008 (NA). The combination of the lens (TL1) 10006 and the lens (TL2) 10009 can zoom the magnification. Subsequently, the enlarged projection is performed by the lens (PL) 741, and an image is formed on an MCP (micro channel plate) on the detector 761. In this optical system, NA is disposed between TL1-TL2. The system is optimized to configure an optical system capable of reducing off-axis aberrations.

Detector

A photoelectronic image from the wafer to be formed by the secondary optical system is amplified by the micro channel plate (MCP), subsequently collides with a fluorescent screen and converted into an optical image. According to the principle of the MCP, a prescribed voltage is applied using a hundred of significantly fine, conductive glass capillaries that are bundled to have a diameter 6 to 25 μm and a length of 0.24 to 1.0 mm and formed into a shape of a thin plate, thereby allowing each of the capillaries to function as independent electronic amplifier; the entire capillaries thus form an integrated electronic amplifier.

The image converted into light by the detector is projected on a TDI (time delay integration)-CCD (charge coupled device) by an FOP (fiber optical plate) system disposed in the atmosphere through a vacuum transmissive window in one-to-one mapping. According to another projection method, the FOP coated with fluorescent material is connected to the surface of a TDI sensor, and a signal electronically/optically converted in a vacuum may be introduced into the TDI sensor. This case has a more efficient transmittance and efficiency of an MTF (modulation transfer function) than the case of being arranged in the atmosphere has. For instance, the transmittance and MTF can be high values of ×5 to ×10. Here, the combination of the MCP and TDI may be adopted as the detector as described above. Instead, an EB (electron bombardment)-TDI or an EB-CCD may be adopted. In the case of adopting the EB-TDI, photoelectrons caused on the surface of the sample and forming a two-dimensional image is directly incident onto the surface of the EB-TDI sensor. Accordingly, an image signal can be formed without degradation in resolution. For instance, in the case of the combination of the MCP and TDI, electronic amplification is performed by the MCP, and electronic/optical conversion is performed by fluorescent material or a scintillator, and information on the optical image is delivered to the TDI sensor. In contrast, the EB-TDI and the EB-CCD have no component for electronic/optical conversion and no transmission component for optical amplification information and thus have no loss due to the component. Accordingly, a signal can be transmitted to the sensor without image degradation. For instance, in the case of adopting the combination of the MCP and TDI, the MTF and contrast are ½ to ⅓ of the MTF and contrast in the cases of adopting the EB-TDI and the EB-CCD.

In this embodiment, it is provided that a high voltage of 10 to 50 kV is applied to the objective lens system 724, and the wafer W is arranged.

Figure 9:
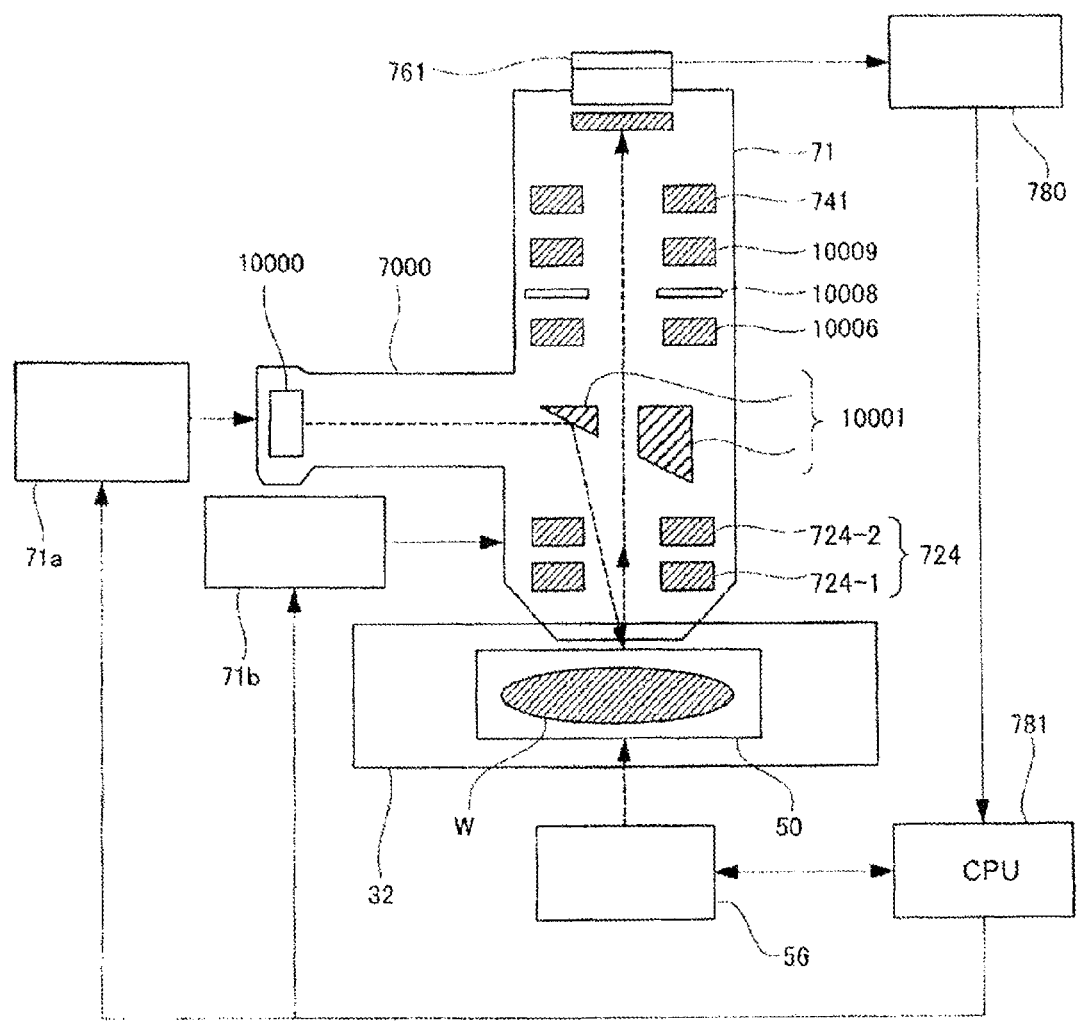
FIG. 9 is a diagram showing the entire configuration of the inspection apparatus according to an embodiment.

Description on Relationship of Main Functions of Mapping Projection System and Overview FIG. 9 is a diagram showing the entire configuration of this embodiment. However, certain parts of components are abbreviated in the diagram.

In FIG. 9, the inspection apparatus includes the lens tube 71, a light source tube 7000, and a chamber 32. The light source 10000 is provided in the light source tube 7000. The primary optical system 72 is disposed on the optical axis of a light beam (primary light beam) emitted from the light source 10000. The stage device 50 is installed in the chamber 32. The wafer W is mounted on the stage device 50.

Meanwhile, the cathode lens 724 (724-1 and 724-2), the transfer lenses 10006 and 10009, the numerical aperture (NA) 10008, the lens 741 and the detector 761 are disposed on the optical axis of a secondary beam emitted from the wafer W, in the lens tube 71. The numerical aperture (NA) 10008 corresponds to an aperture stop, and is a thin plate that is made of metal (Mo. etc.) and has a circular hole.

The output of the detector 761 is input into a control unit 780. The output of the control unit 780 is input into a CPU 781. Control signals of the CPU 781 are input into a light source control unit 71a, a lens tube control unit 71b and a stage driving mechanism 56. The light source control unit 71a controls power supply to the light source 10000. The lens tube control unit 71b controls the lens voltages of the cathode lens 724, the lenses 10006 and 10009, and the lens 741, and the voltage of an aligner (not shown) (control of deflection).

The stage driving mechanism 56 transmits position information of the stage to the CPU 781. The light source tube 7000, the lens tube 71, and the chamber 32 communicate with a vacuum evacuation system (not shown). Air in the vacuum evacuation system is evacuated by a turbo pump of the vacuum evacuation system, and the inside of the chamber is kept in a vacuum. A rough evacuation system that typically adopts a dry pump or a rotary pump is disposed on a downstream side of the turbo pump.

When the sample is irradiated with the primary light beam, photoelectrons occur as the secondary beam from the surface of the wafer W irradiated with the light beam.

The secondary beam passes through the cathode lens 724, the group of TL lenses 10006 and 10009 and the lens (PL) 741, and is guided to the detector and formed as an image.

The cathode lens 724 includes three electrodes. It is designed such that the lowermost electrode forms a positive electric field with respect to the potential on the side of the sample W, and electrons (more specifically, secondary electrons having a small directivity) are extracted and efficiently guided into the lens. Thus, it is effective that the cathode lens is bi-telecentric. The secondary beam image-formed by the cathode lens passes through the hole of the mirror 10001.

If the secondary beam is image-formed by only one stage of the cathode lens 724, the effect of the lens is too strong. Accordingly, aberration easily occurs. Thus, the two stages of the doublet lens system are adopted for a formation of an image. In this case, the intermediate image formation position is between the lens (TL1) 10006 and the cathode lens 724. Here, as described above, the bi-telecentric configuration significantly exerts an advantageous effect of reducing the aberration. The secondary beam is converged on the numerical aperture (NA) 10008 by the cathode lens 724 and the lens (TL1) 10006, thereby forming a crossover. The image is formed between the lens 724 and lens (TL1) 10006. Subsequently, an intermediate magnification is defined by the lens (TL1) 10006 and the lens (TL2) 10009. The image is enlarged by the lens (PL) 741 and formed on the detector 761. That is, in this example, the image is formed three times as a total.

All the lenses 10006, 10009 and 741 are rotationally symmetrical lenses referred to as unipotential lenses or einzel lenses. The lenses have a configuration including three electrodes. Typically, the external two electrodes are zero potential, and control is performed by applying a voltage to the central electrode to exert a lens effect. The configuration is not limited to this lens configuration. Instead, the case of a configuration including a focus adjustment electrode on the first or second stage or both the stages of the lens 724, the case of including dynamic focus adjustment electrode and has a quadrupole or quintuple-pole configuration can be adopted. The field lens function may be added to the PL lens 741 to reduce off-axis aberrations, and a quadrupole or quintuple-pole configuration may effectively be adopted to increase the magnification.

The secondary beam is enlarged and projected by the secondary optical system, and image-formed on the detection surface of the detector 761. The detector 761 includes: the MCP that amplitudes electrons; a fluorescent plate that converts the electrons into light; a lens or another optical element for relaying an optical image between the vacuum system and the outside; and an image pickup element (CCD etc.). The secondary beam is image-formed on the MCP detection surface, and amplified. The electrons are converted into an optical signal by the fluorescent plate, and further converted into a photoelectric signal by an image pickup element.

The control unit 780 reads the image signal of the wafer W from the detector 761 and transmits the read signal to the CPU 781. The CPU 781 inspects defect on a pattern based on the image signal according to template matching or the like. The stage device 50 is movable in the XY direction by the stage driving mechanism 56. The CPU 781 reads the position of the stage device 50, outputs a drive control signal to the stage driving mechanism 56 to drive the stage device 50, thereby sequentially detecting and inspecting images.

As to change in magnification, even if a set magnification, which is lens conditions of the lenses 10006 and 10009, is changed, a uniform image can be acquired on the entire field of view on the detection side. In this embodiment, a uniform image without irregularity can be acquired. However, increase in magnification causes a problem of decreasing the brightness of the image. In order to solve the problem, the lens condition of the primary optical system is set such that the amount of emitted electrons per unit pixel is constant when the lens condition of the secondary optical system is changed to change the magnification.

Precharge Unit

As shown in FIG. 1, the precharge unit 81 is arranged adjacent to the lens tube 71 of the electronic optical device 70 in the working chamber 31. This inspection apparatus is an apparatus that inspects a device pattern and the like formed on the surface of the wafer by irradiating the substrate as the inspection object, i.e., wafer, with the electron beam. The information on the photoelectrons caused by irradiation with the light beam is information on the surface of the wafer. However, the surface of the wafer may be charged (charged up) according to conditions, such as a wafer material, the wavelength and energy of irradiation light or laser. Furthermore, a strongly charged spot and a weakly charged spot may occur on the surface of the wafer. If there is irregularity of the amount of charge on the surface of the wafer, the photoelectronic information also includes irregularity. Accordingly, correct information cannot be acquired. Thus, in this embodiment, to prevent the irregularity, the precharge unit 81 including a charged particles irradiation unit 811 is provided. Before a prescribed spot on the wafer to be inspected is irradiated with light or laser, charged particles are emitted from the charged particles irradiation unit 811 of the precharge unit to eliminate charging irregularity. The charging-up on the surface of the wafer preliminarily forms an image of the surface of the wafer, which is a detection object. Detection is performed by evaluating the image to operate the precharge unit 81 on the basis of the detection.

Embodiment 1

Semiconductor Inspection Apparatus Including Double Pipe Structure Lens Tube

As described above, the electronic optical device 70 including the primary optical system 2100, which is described as the second embodiment of the primary optical system, is different in setting of voltages applied to the respective configurational components from a typical electron gun. That is, reference potential V2 is used as the high voltage (e.g., +40000 V). First, the semiconductor inspection apparatus 1 including the electronic optical device 70 has a double pipe structure.

Figure 10:
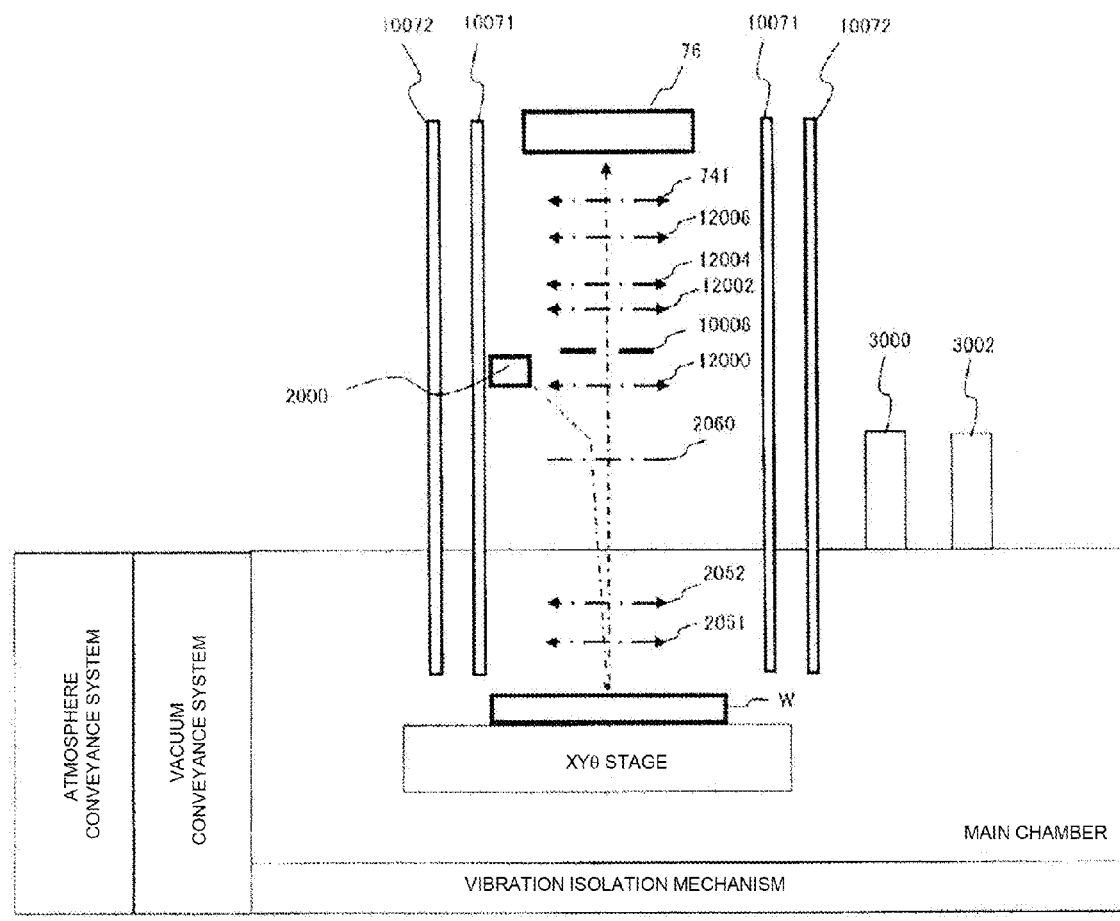
FIG. 10 is a diagram schematically showing a double pipe structure of a semiconductor inspection apparatus according to an embodiment.

Description will be made with reference to FIG. 10. FIG. 10 is a diagram schematically showing the double pipe structure of the semiconductor inspection apparatus according to one embodiment. In FIG. 10, the first pipe and the second pipe are emphasized. The sections of the actual first pipe and second pipe are different from the illustration. As shown in FIG. 10, the electronic optical device 70 including the primary optical system 2000 includes two pipes, which are the first pipe 10071, and a second pipe 10072 provided outside of the first pipe 10071. In other words, the device has a double pipe structure. The double pipe structure internally stores a light source, a primary optical system, a secondary optical system and a detector. A high voltage (e.g., +40000 V) is applied to the first pipe 10071. The second pipe 10072 is set to GND. The first pipe 10071 secures a spatial reference potential V0 with reference to the high voltage. The first pipe is surrounded by the second pipe and is thus set to GND. This configuration achieves GND connection in the apparatus installation and prevents electric shock. The pipe 10071 is fixed to the pipe 10072 by insulative components. The pipe 10072 is set to GND, and attached to the main housing 30. The primary optical system 2000, the secondary optical system, the detection system 76 and the like are arranged in the first pipe 10071.

An internal partition wall between the first pipe 10071 and the second pipe 10072, even including components screws and the like, are made of nonmagnetic material not to affect the magnetic field, thereby preventing the magnetic field from affecting the electron beam. Although not shown in FIG. 10, a space is provided at the side of the second pipe 10072. In the space, a protrusion is connected in which parts of the primary optical system 2000, such as the light source and the photoelectron generator, are arranged. A space similar to the space provided for the second pipe 10072 is also provided for the first pipe 10071. Photoelectrons occurring from the photoelectron generation portion pass through the spaces, and the sample is irradiated with the photoelectrons. The light source is not necessarily provided in the second pipe 10072. Instead, the light source may be provided on the atmosphere side, and light may be introduced into the photoelectron generation portion stored in the second pipe 10072 on the vacuum side. However, the primary optical system and the secondary optical system are necessarily stored in the double pipe structure. The detector may be disposed in the first pipe 10071, or at the position with a potential independent from the first and second pipes. Here, the potential of the detection surface of the detector is set to any value to control the energy of electrons incident on the detector to have an appropriate value. In a state of potential separation by the insulative component from the pipe 1 and the pipe 2, any voltage is applied to the detector to achieve a detection sensor surface potential, thereby allowing operation. Here, provided that the sensor surface potential is VD, the energy incident on the sensor surface is defined by VD-RTD. In the case where EB-CCD or EB-TDI is adopted as the detector, it is effective to set the incident energy to 1 to 7 keV for the sake of reducing damage to the sensor and use for a long period of time.

Electronic Inspection Apparatus

Figure 11:
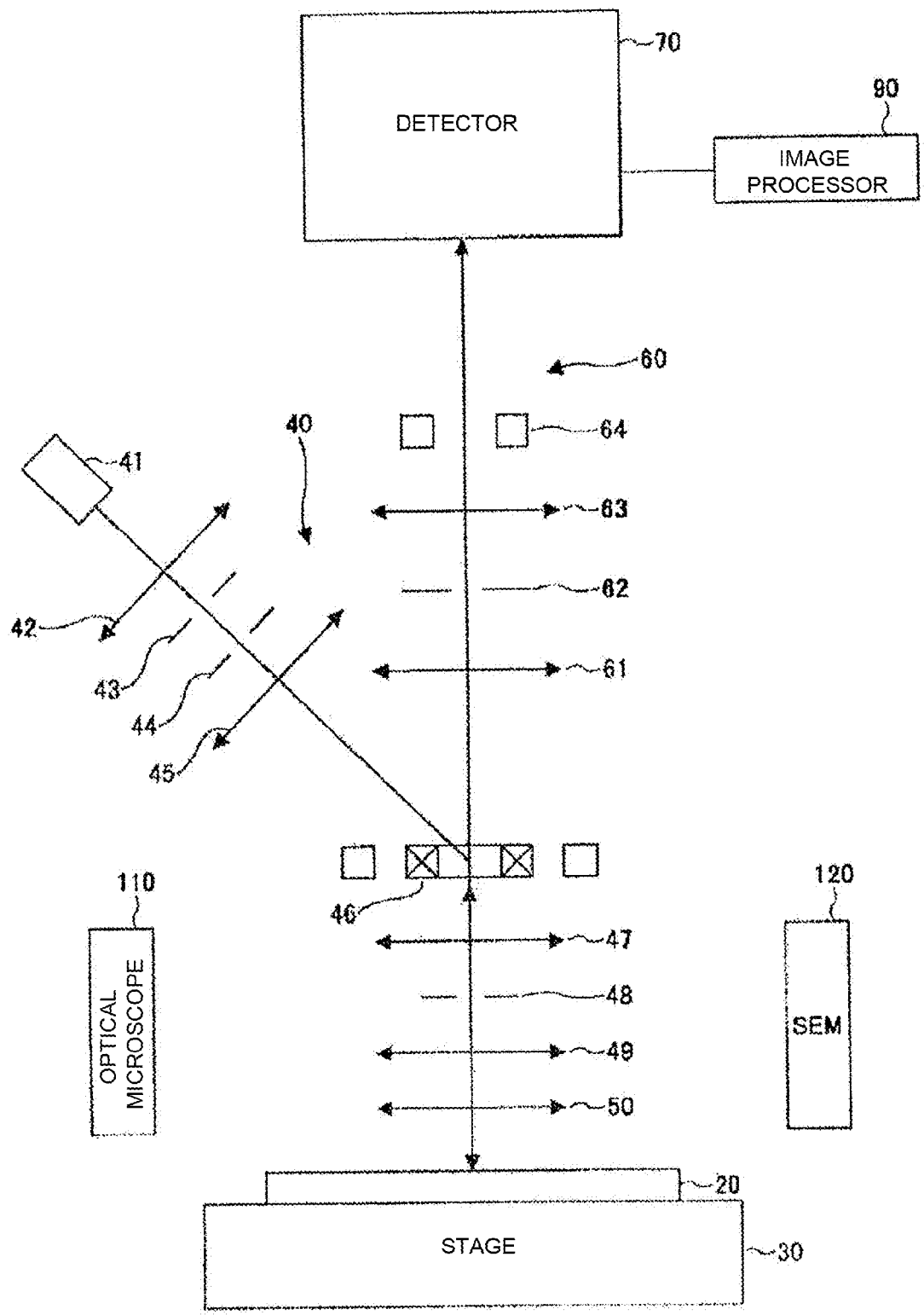
FIG. 11 is a diagram showing a configuration of an electron beam inspection apparatus according to an embodiment.

FIG. 11 is a diagram showing a configuration of an electron beam inspection apparatus. The above description has been made mainly on the principle of the foreign matter inspection method. The foreign matter inspection apparatus applied to performing the foreign matter inspection method will herein be described. Accordingly all of the aforementioned foreign matter inspection methods are applicable to the following foreign matter inspection apparatus.

An inspection object of the electron beam inspection apparatus is a sample 20. The sample 20 is any of a silicon wafer, a glass mask, a semiconductor substrate, a semiconductor pattern substrate, and a substrate having a metal film. The electron beam inspection apparatus according to this embodiment detects presence of a foreign matter 10 on the surface of the sample 20 that is any one of these substrates. The foreign matter 10 is insulative material, conductive material, semiconductor material, or a composite thereof. The types of the foreign matter 10 include particles, cleaning residues (organic matters), reaction products on the surface and the like. The electron beam inspection apparatus may be an SEM type apparatus or a mapping projection apparatus. In this example, the present technology is applied to the mapping projection inspection apparatus.

The mapping projection type electron beam inspection apparatus includes: a primary optical system 40 that generates an electron beam; a sample 20; a stage 30 on which the sample is mounted; a secondary optical system 60 that forms an enlarged image of secondarily released electrons or mirror electrons from the sample; a detector 70 that detects the electrons; an image processor 90 (image processing system) that processes a signal from the detector 70; an optical microscope 110 for alignment; and an SEM 120 for review. The detector 70 may be included in the secondary optical system 60. The image processor 90 may be included in the image processor.

The primary optical system 40 generates an electron beam, and irradiates the sample 20. The primary optical system 40 includes an electron gun 41; lenses 42 and 45; apertures 43 and 44; an ExB filter 46; lenses 47, 49 and 50; and an aperture 48. The electron gun 41 generates an electron beam. The lenses 42 and 45 and apertures 43 and 44 shape the electron beam and control the direction of the electron beam. In the ExB filter 46, the electron beam is subjected to a Lorentz force due to a magnetic field an electric field. The electron beam enters the ExB filter 46 in an inclined direction, is deflected into a vertically downward direction, and travels toward the sample 20. The lenses 47, 49 and 50 control the direction of the electron beam and appropriately decelerate, thereby controlling the landing energy LE.

The primary optical system 40 irradiates the sample 20 with the electron beam. As described above, the primary optical system 40 performs irradiation with both an electron beam for precharging and an imaging electron beam. In experiment results, the difference between a precharging landing energy LE1 and a landing energy LE2 for an imaging electron beam is preferably 5 to 20 [eV].

In terms of this point, it is provided that in the case with a potential difference between the potential of the foreign matter 10 and the potential therearound, the precharging landing energy LE1 is emitted in a negative charging region. In conformity with the value of LE1, the charging up voltage varies. This variation is because of variation in a relative ratio of the LE1 and the LE2 (LE2 is a landing energy of the imaging electron beam as described above). If the LE1 is high, the charging up voltage is high. Accordingly, a reflection point is formed at an upper position of the foreign matter 10 (position close to the detector 70). The trajectory and transmittance of the mirror electrons vary according to the reflection point. Thus, the optimal charging-up voltage conditions are determined according to the reflection point. If the LE1 is too low, an efficiency of forming the mirror electrons reduces. The present technology has found that the difference between the LE1 and the LE2 is preferably 5 to 20 [eV]. The value of the LE1 is preferably 0 to 40 [eV], and further preferably 5 to 20 [eV].

In the primary optical system 40 of the mapping projection optical system, the ExB filter 46 is particularly important. The primary electron beam angle can be defined by adjusting the conditions of the electric field and the magnetic field of the ExB filter 46. For instance, the irradiation electron beam of the primary system and the electron beam of the secondary system can set the conditions of ExB filter 46 so as to make the incidence substantially rectangular to the sample 20. In order to further increase the sensitivity, for instance, it is effective to incline the incident angle of the electron beam of the primary system with respect to the sample 20. An appropriate inclined angle is 0.05 to 10 degrees, preferably is about 0.1 to 3 degrees.

Thus, the signal from the foreign matter 10 is strengthened by emitting the electron beam at an inclination of a prescribed angle $\theta$ with respect to the foreign matter 10. Accordingly, conditions where the trajectory of the mirror electron does not deviate from the center of the secondary optical axis can be formed. Thus, the transmittance of the mirror electron can be increased. Accordingly, in the case where the foreign matter 10 is charged up and the mirror electrons are guided, the inclined electron beam is significantly efficiently used.

Referring again to FIG. 25, the stage 30 is means for mounting the sample 20, and movable in the horizontal x-y directions and the $\theta$ direction. The stage 30 may be also movable in the z direction as necessary. Means for fixing a sample, such as an electrostatic chuck, may be provided on the surface of the stage 30.

The sample 20 is on the stage 30. The foreign matter 10 is on the sample 20. The primary optical system 40 irradiates the surface 21 of the sample with the electron beam at a landing energy LE of 5 to −10 [eV]. The foreign matter 10 is charged up, incident electrons in the primary optical system 40 recoil without coming into contact with the foreign matter 10. Accordingly, the mirror electrons are guided by the secondary optical system 60 to the detector 70. Here, the secondarily released electrons are released from the surface 21 of the sample in spread directions. Accordingly, the transmittance of the secondarily released electrons is a low value, for instance, about 0.5 to 4.0%. In contrast, the direction of the mirror electron is not scattered. Accordingly, a transmittance of the mirror electrons of about 100% can be achieved. The mirror electrons are formed on the foreign matter 10. Thus, only the signal of the foreign matter 10 can achieve a high luminance (the state with the large amount of electrons). The difference of the luminance from the ambient secondarily released electrons and the ratio of the luminance increase, thereby allowing high contrast to be achieved.

As described above, the image of the mirror electron is enlarged at a magnification higher than the optical magnification. The magnification ratio reaches 5 to 50. In typical conditions, the magnification ratio is often 20 to 30. Here, even if the pixel size is three times as large as the size of the foreign matter, the foreign matter can be found. Accordingly, high speed and high throughput can be achieved.

For instance, in the case where the size of the foreign matter 10 has a diameter of 20 [nm], it is sufficient that the pixel size is 60[nm], 100[nm], 500[nm] or the like. As with this example, the foreign matter can be imaged and inspected using the pixel size three times as large as the size of the foreign matter. This feature is significantly excellent for high throughput in comparison with the SEM system and the like.

The secondary optical system 60 is means for guiding electrons reflected by the sample 20 to the detector 70. The secondary optical system 60 includes lenses 61 and 63, a NA aperture 62, an aligner 64, and a detector 70. The electrons are reflected by the sample 20, and pass again through the objective lens 50, the lens 49, the aperture 48, the lens 47 and the E×B filter 46. The electrons are then guided to the secondary optical system 60. In the secondary optical system 60, electrons pass through the lens 61, the NA aperture 62 and the lens 63 and are accumulated. The electrons are adjusted by the aligner 64, and detected by the detector 70.

The NA aperture 62 has a function of defining the secondary transmittance and aberrations. The size and the position of the NA aperture 62 are selected such that the difference between the signal from the foreign matter 10 (mirror electron etc.) and the signal from the ambient portions (normal portions) is large. Instead, the size and the position of the NA aperture 62 are selected such that the ratio of the signal from the foreign matter 10 with respect to the ambient signal is large. Thus, the S/N ratio can be high.

For instance, it is provided that the NA aperture 62 can be selected in a range of φ50 to φ3000 [μm]. Detected electrons are mixture of mirror electrons and secondarily released electrons. In such situations, the aperture size is effectively selected in order to improve the S/N ratio of the mirror electron image. In this case, it is preferred to select the size of the NA aperture 62 such that the transmittance of the mirror electrons is maintained by reducing the transmittance of the secondarily released electrons.

For instance, in the case where the incident angle of the primary electron beam is 3°, the reflection angle of the mirror electrons is about 3°. In this case, it is preferred to select the size of the NA aperture 62 that allows the trajectory of the mirror electrons to pass. For instance, the appropriate size is φ250 [μm]. Because of the limitation to the NA aperture (diameter φ250 [μm]), the transmittance of the secondarily released electrons is reduced. Accordingly, the S/N ratio of the mirror electron image can be improved. For instance, in the case where the aperture diameter is from φ2000 to φ250 [μm], the background gradation (noise level) can be reduced to ½ or less.

Referring again to FIG. 25, the detector 70 is means for detecting electrons guided by the secondary optical system 60. The detector 70 has a plurality of pixels on the surface. Various two-dimensional sensors may be adopted as the detector 70. For instance, the detector 70 may be any of a CCD (charge coupled device) and a TDI (time delay integration)-CCD. These are sensors that convert electrons into light and then detect signals. Accordingly, photoelectronic conversion means is required. Thus, electrons are converted into light using photoelectronic conversion or a scintillator. Optical image information is transmitted to the TDI that detects light. The electrons are thus detected.

Here, an example where the EB-TDI is applied to the detector 70 will be described. The EB-TDI does not require a photoelectronic conversion mechanism and an optical transmission mechanism. The electrons are directly incident on the EB-TDI sensor surface. Accordingly, the high MTF (modulation transfer function) and contrast can be acquired without degradation in resolution. Conventionally, detection of small foreign matters 10 has been unstable. In contrast, use of the EB-TDI can improve the S/N ratio of a weak signal of the small foreign matters 10. Accordingly, a higher sensitivity can be achieved. The S/N ratio improves by a factor of 1.2 to 2.

Figure 12:
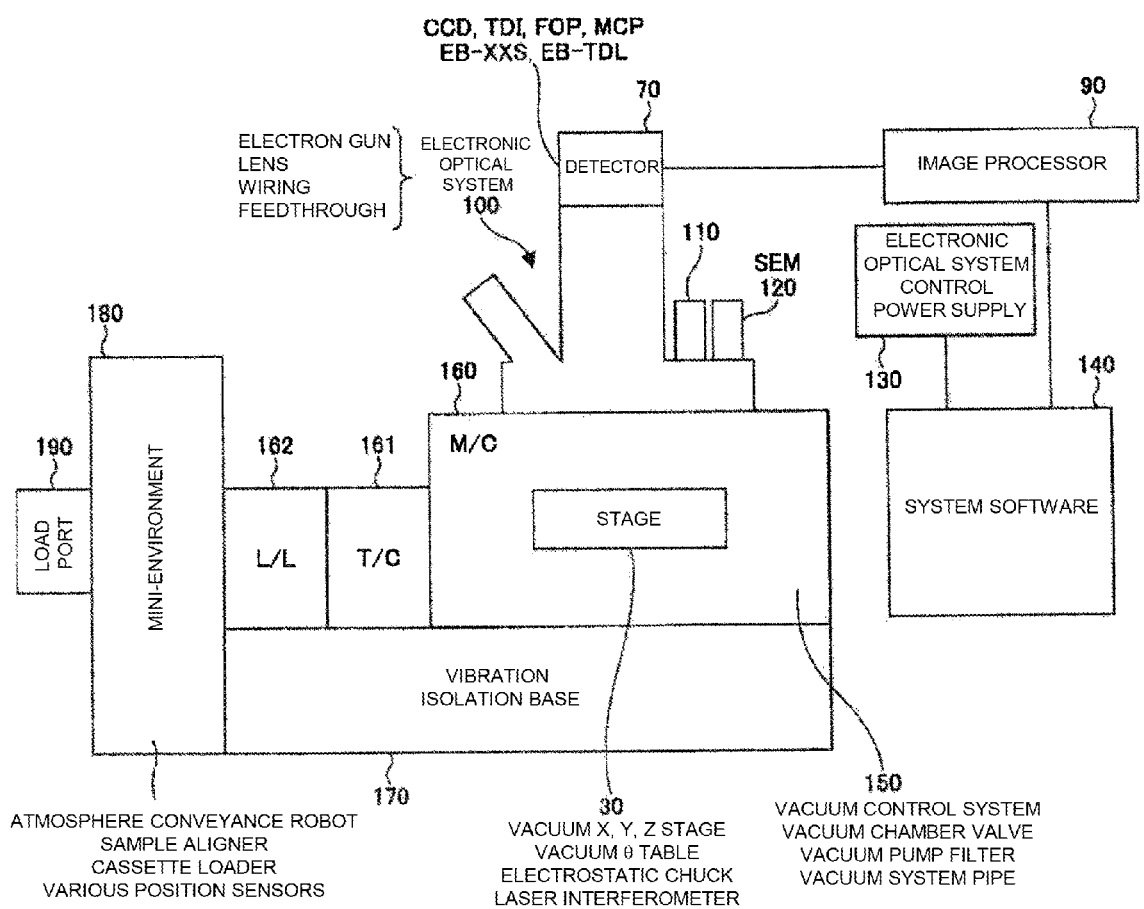
FIG. 12 is a diagram showing an electron beam inspection apparatus to which the present technology is applied, according to an embodiment.

FIG. 12 shows an electron beam inspection apparatus. Here, an example of the entire system configuration will be described.

In FIG. 12, the foreign matter inspection apparatus includes: a sample carrier 190; a mini-environment 180; a load lock 162; a transfer chamber 161; a main chamber 160; an electron beam column system 100; and an image processor 90. A conveyance robot in the atmosphere, a sample alignment device, clean air supply mechanism and the like are provided in the mini-environment 180. A conveyance robot in a vacuum is provided in the transfer chamber 161. The robots are arranged in the transfer chamber 161 that is always in a vacuum state. Accordingly, occurrence of particles and the like due to pressure variation can be suppressed to the minimum.

The stage 30 that moves in the X and Y directions and the θ (turning) direction is provided in the main chamber 160. An electrostatic chuck is provided on the stage 30. The sample 20 itself is provided at the electrostatic chuck. Instead, the sample 20 is held by the electrostatic chuck in a state of being arranged on a pallet or a jig.

The main chamber 160 is controlled by the vacuum control system 150 such that the inside of the chamber is kept in a vacuum. The main chamber 160, the transfer chamber 161 and the load lock 162 are mounted on a vibration isolation base 170. The configuration prevents vibrations from the floor from being transmitted.

An electron column 100 is provided on the main chamber 160. The electron column 100 includes: columns of a primary optical system 40 and a secondary optical system 60; and a detector 70 that detects secondarily released electrons, mirror electrons and the like from the sample 20. The signal from the detector 70 is transmitted to the image processor 90 and processed. Both on-time signal processing and off-time signal processing can be performed. The on-time signal processing is performed during inspection. In the case of off-time signal processing, only an image is acquired and the signal processing is performed thereafter. Data processed in the image processor 90 is stored in recording media, such as a hard disk and memory. The data can be displayed on a monitor of a console, as required. The displayed data is, for instance, an inspection region, a map of the number of foreign matters, the size distribution and map of foreign matters, foreign matter classification, a patch image and the like. System software 140 is provided in order to perform signal processing. An electronic optical system control power supply 130 is provided in order to supply power to the electron column system. The optical microscope 110 and the SEM inspection apparatus 120 may be provided in the main chamber 160.

Figure 13:
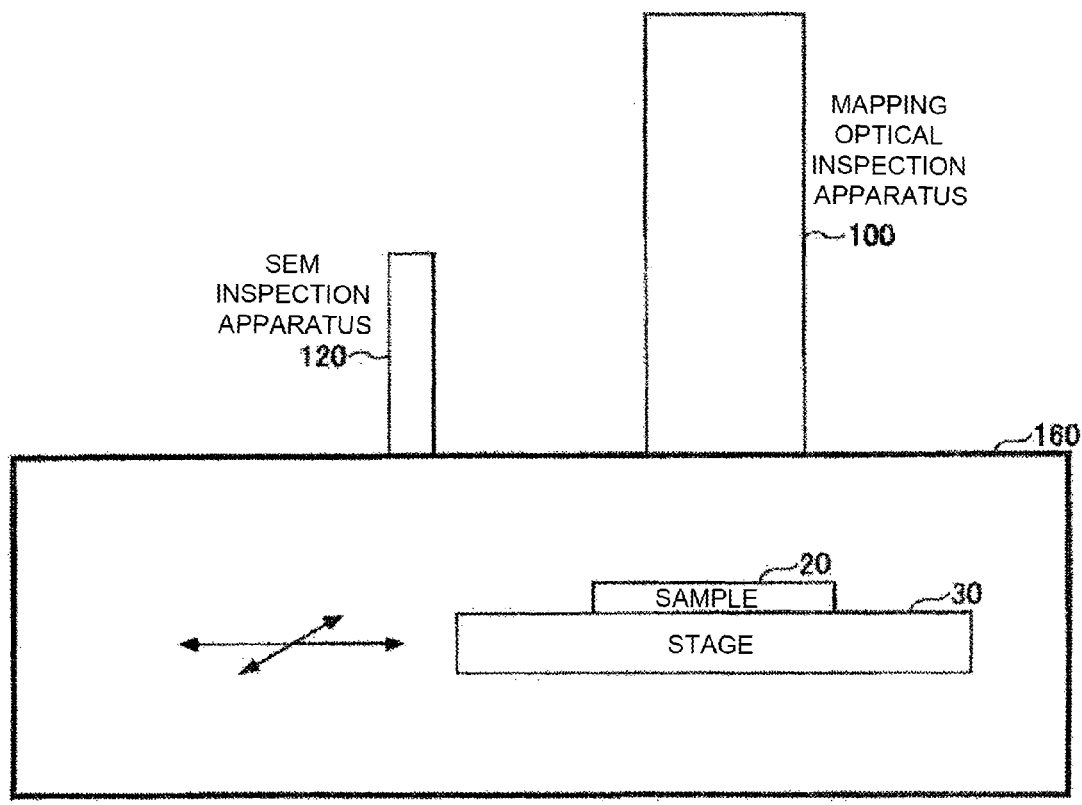
FIG. 13 is a diagram showing an example of a configuration where an electron column of a mapping optical system inspection apparatus and an SEM inspection apparatus are provided in the same main chamber, according to an embodiment.

FIG. 13 shows an example of a configuration in the case where an electron column 100 and an SEM inspection apparatus 120 of a mapping optical system inspection apparatus are provided in the same main chamber 160. The arrangement of the mapping optical system inspection apparatus and the SEM inspection apparatus 120 in the same chamber 160 as shown in FIG. 13 is significantly advantageous. A sample 20 is mounted on the same stage 30. The sample 20 can be observed or inspected according to the mapping system and SEM system. A method of using this configuration and advantageous effects thereof are as follows.

Since the sample 20 is mounted on the same stage 30, the coordinate relationship is uniquely defined when the sample 20 is moved between the mapping system electron column 100 and the SEM inspection apparatus 120. Accordingly, when the detection positions of foreign matters are identified, two inspection apparatuses can easily highly accurately identify the same position.

In the case where above configuration is not applied, for instance, the mapping optical inspection apparatus and the SEM inspection apparatus 120 are configured to be separated from each other as different apparatuses. The sample 20 is moved between the separated apparatuses. In this case, the sample 20 is required to be mounted on the separate stages 30. Accordingly, the two apparatuses are required to separately align the sample 20. In the case of separately aligning the sample 20, specific errors at the same position are unfortunately 5 to 10 [μm]. In particular, in the case of the sample 20 with no pattern, the positional reference cannot be identified. Accordingly, the error further increases.

In contrast, in this embodiment, as shown in FIG. 13, the sample 20 is mounted on the stage 30 in the same chamber 160 in two types of inspections. Even in the case where the stage 30 is moved between the mapping type electron column 100 and the SEM inspection apparatus 120, the same position can be highly accurately identified. Accordingly, even in the case of the sample 20 with no pattern, the position can be highly accurately identified. For instance, the position can be identified at an accuracy of 1 [μm] or less.

Such highly accurate identification is significantly advantageous in the following case. First, foreign matter inspection on the sample 20 with no pattern is performed according to the mapping method. The detected foreign matter 10 is then identified and observed (reviewed) in detail by the SEM inspection apparatus 120. Since the accurate position can be identified, not only presence or absence of the foreign matter 10 (pseudo-detection in the case of absence) can be determined but also the size and shape of the foreign matter 10 can be observed in detail at high speed.

As described above, the separate arrangement of the electron column 100 for detecting foreign matters and the SEM inspection apparatus 120 for reviewing takes much time for identifying the foreign matter 10. In the case of the sample with no pattern, the difficulty is increased. Such problems are solved by this embodiment.

As described above, in this embodiment, through use of the aperture imaging conditions for the foreign matter 10 according to the mapping optical system, a significantly fine foreign matter 10 can be highly sensitively detected. Furthermore, the mapping optical type electron column 100 and the SEM inspection apparatus 120 are mounted in the same chamber 160. Thus, in particular, inspection on the significantly fine foreign matter 10 with a dimension of 30[nm] or less determination and classification of the foreign matter 10 can be performed significantly efficiently at high speed. This embodiment is also applicable to the aforementioned Embodiments 1 to 3 and embodiments to which no numeral is assigned.

Next, another example using both the mapping projection type inspection apparatus and the SEM will be described.

The above description has been made where the mapping projection type inspection apparatus detects the foreign matters and the SEM performs reviewing inspection. The two inspection apparatuses can be applied to another method. Combination of the inspection apparatuses can perform effective inspection. For instance, the other method is as follows.

In this inspection method, the mapping projection type inspection apparatus and the SEM inspect respective regions different from each other. Furthermore, the "cell to cell (cell to cell)" inspection is applied to the mapping projection type inspection apparatus, and the "die to die (die to die)" inspection is applied to the SEM. Accordingly, highly accurate inspection is effectively achieved as a whole.

More specifically, the mapping projection type inspection apparatus performs "cell to cell" inspection in a region with many repetitive patterns in the die. The SEM performs the "die to die" inspection in a region with a small number of repetitive patterns. Both inspection results are combined and one inspection result is acquired. The "die to die" inspection compares images of two dice that are sequentially acquired. The "cell to cell" inspection compares images of two cells that are sequentially acquired. The cell is a part of a die.

The inspection method performs high speed inspection using mapping projection on repetitive pattern portions while performing inspection on regions with a small number of repetitive patterns using the SEM that can achieve high accuracy and small number of artifacts. The SEM is not suitable to high speed inspection. However, since the region with a small number of repetitive patterns is relatively narrow, the inspection time by the SEM is not too long. Accordingly, the entire inspection time can be suppressed short. Thus, this inspection method can take advantage of the two methods at the maximum, and perform highly accurate inspection in a short inspection time.

Next, referring again to FIG. 27, the mechanism of conveying the sample 20 will be described.

The sample 20, such as a wafer or a mask, is conveyed through a load port into the mini-environment 180, and an alignment operation is performed in the environment. The sample 20 is conveyed to the load lock 162 by the conveyance robot in the atmosphere. The load lock 162 is evacuated from the atmosphere to a vacuum state by the vacuum pump. After the pressure becomes below a prescribed value (about 1 [Pa]), the sample 20 is conveyed by the conveyance robot in the vacuum disposed in the transfer chamber 161 from the load lock 162 to the main chamber 160. The sample 20 is mounted on the electrostatic chuck mechanism on the stage 30.

Figure 14:
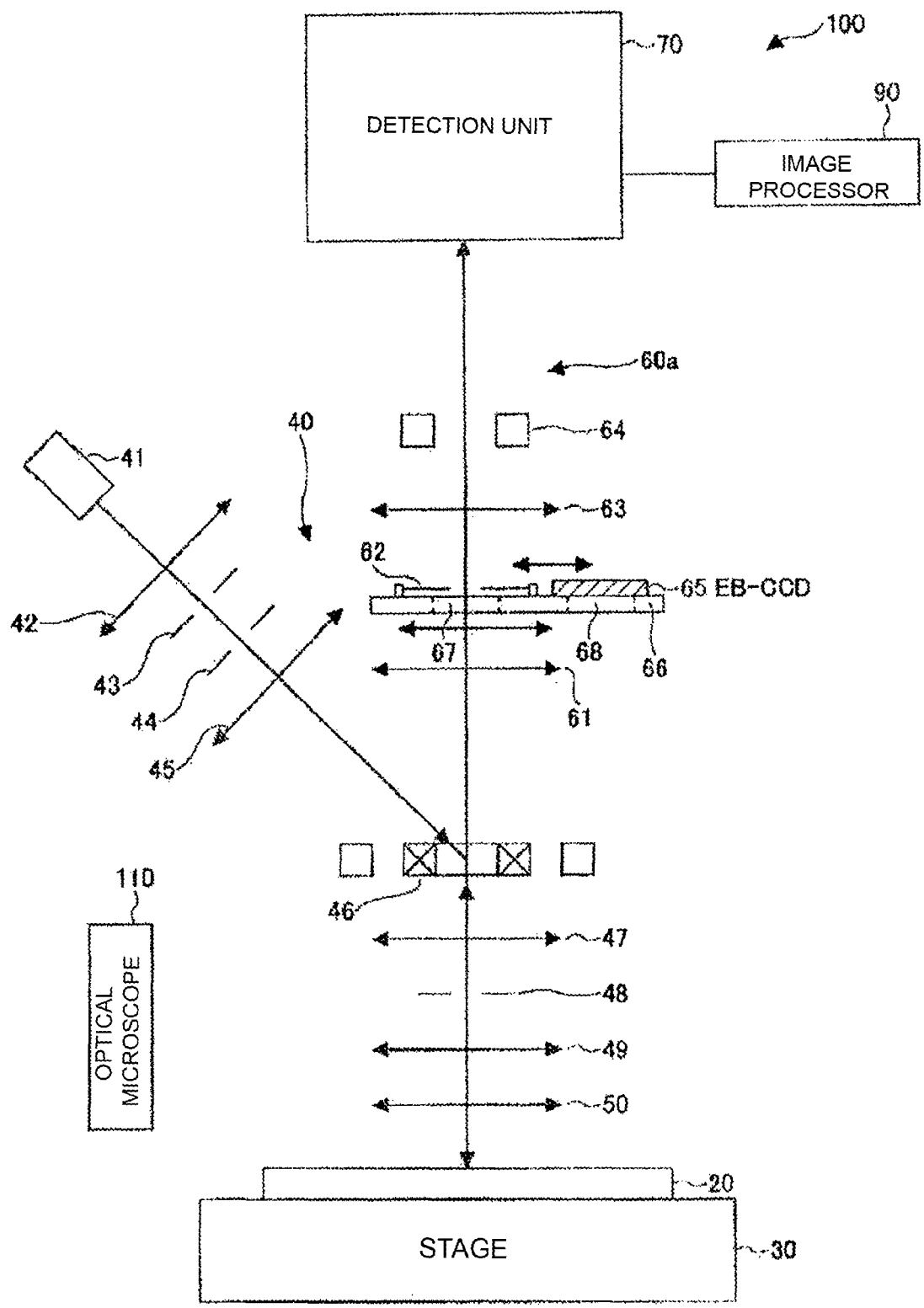
FIG. 14 is a diagram showing a configuration of an electron column system according to an embodiment.

FIG. 14 shows the inside of a main chamber 160 and an electron column system 100 arranged on the top of the main chamber 160. Reference symbols similar to those of FIG. 11 are assigned to configurational components similar to those of FIG. 11. The description thereof is omitted.

A sample 20 is mounted on a stage 30 movable in X, Y, Z and θ directions. The stage 30 and an optical microscope 110 perform highly accurate alignment. A mapping projection optical system performs foreign matter inspection and pattern defect inspection of the sample 20 using an electron beam. Here, the potential of the sample surface 21 is important. In order to measure the surface potential, a surface potential measurement device capable of measurement in a vacuum is attached to the main chamber 160. The surface potential measurement device measures the two-dimensional surface potential distribution on the sample 20. On the basis of the measurement result, focus control is performed in a secondary optical system 60a that forms an electron image. A focus map of the two-dimensional positions of the sample 20 is created on the basis of the potential distribution. Inspection is performed while changing and controlling the focus under inspection. Accordingly, the blurring and aberrations of an image due to variation in circular potential on the surface according to the position can be reduced. Highly accurate and stable image acquisition and inspection can be achieved.

Here, the secondary optical system 60a is configured so as to be capable of measuring detected current of electrons incident on an NA aperture 62 and a detector 70. Furthermore, this system is configured such that an EB-CCD can be arranged on the position of the NA aperture 62. Such a configuration is significantly advantageous and effective. In FIG. 14, the NA aperture 62 and the EB-CCD 65 are arranged on a holding member 66 that integrally includes openings 67 and 68. The secondary optical system 60a is provided with a mechanism capable of independently performing current absorption of the NA aperture 62 and image acquisition of the EB-CCD 65. In order to achieve this mechanism, the NA aperture 62 and the EB-CCD 65 are arranged in the XY stage 66 movable in a vacuum. Accordingly, positional control and positioning can be performed on the NA aperture 62 and the EB-CCD 65. Since the stage 66 is provided with the openings 67 and 68, mirror electrons and secondarily emitted electrons can pass through the NA aperture 62 or the EB-CCD 65.

The operation of the secondary optical system 60*a* having such a configuration is described. First, the EB-CCD 65 detects the spot shape and the center position of a secondary electron beam. The voltages of a stigmator, lenses 61 and 63 and an aligner 64 are adjusted such that the spot shape becomes circular and the minimum. In relation to this point, conventionally, the spot shape and astigmatism cannot be directly adjusted at the position of the NA aperture 62. This embodiment can achieve such direct adjustment, and can highly accurately correct the astigmatism.

Furthermore, the center position of the beam spot can be easily detected. The position of the NA aperture 62 can be adjusted such that the center of the NA aperture 62 is arranged at the beam spot position. In relation to this point, conventionally, direct adjustment of the position of the NA aperture 62 cannot be performed. This embodiment can directly adjust the position of the NA aperture 62. Accordingly, the NA aperture can be highly accurately positioned, the aberration of an electron image is reduced, and uniformity is improved. Thus, transmittance uniformity is improved, thereby allowing an electron image having high resolution and uniform gradation to be acquired.

For inspection of a foreign matter 10, it is important to efficiently acquire a mirror signal from the foreign matter 10. Since the position of the NA aperture 62 defines the transmittance and aberration of the signal, this aperture is significantly important. Secondarily emitted electrons are emitted at a wide angle range from the sample surface according to the cosine law, and uniformly reach in a wide region at the NA position (e.g., $\phi$3 [mm]). Accordingly, the secondarily emitted electrons are insensitive to the position of the NA aperture 62. On the contrary, the reflection angle of mirror electrons on the sample surface is almost equivalent to the incident angle of the primary electron beam. Accordingly, the mirror electrons represent a small divergence, and reach the NA aperture 62 with a small beam diameter. For instance, the divergent region of mirror electrons is one twentieth as wide as the divergent region of the secondary electron or less. Accordingly, the mirror electrons are significantly sensitive to the position of the NA aperture 62. The divergent region of the mirror electrons at the NA position is typically a region ranging from $\phi$10 to 100 [μm]. Accordingly, it is significantly advantageous and important to acquire the position with the maximum mirror electron intensity and arrange the center position of the NA aperture 62 at the acquired position.

In order to achieve arrangement of the NA aperture 62 at such an appropriate position, according to a preferred embodiment, the NA aperture 62 is moved in X and Y directions in a vacuum in the electron column 100 at an accuracy about 1 [μm]. The signal intensity is measured while the NA aperture 62 is moved. The position with the maximum signal intensity is acquired, and the center of the NA aperture 62 is disposed at the acquired coordinate position.

The EB-CCD 65 is significantly advantageously used for measuring the signal intensity. This is because two-dimensional information on the beam can be acquired, the number of electrons entering the detector 70 can be acquired to thereby allow the signal intensity to be quantitatively evaluated.

Alternatively, the aperture arrangement may be defined and the condition of the lens 63 between the aperture and the detector may be configured, so as to achieve a conjugate relationship between the position of the NA aperture 62 and the detection surface of the detector 70. This configuration is also significantly advantageous. Thus, an image of a beam at the position of the NA aperture 62 is formed on the detection surface of the detector 70. Accordingly, a beam profile at the position of the NA aperture 62 can be observed using the detector 70.

The NA size (aperture diameter) of the NA aperture 62 is also important. The signal region of mirror electrons is small as described above. Accordingly, an effective NA size ranges from about 10 to 200 [μm]. Furthermore, it is preferred that the NA size be larger by +10 to 100 [%] than the beam diameter.

In relation to this point, the image of electrons is formed of mirror electrons and secondarily emitted electrons. The foregoing setting of the aperture size can further increase the ratio of mirror electrons. Accordingly, the contrast of the mirror electrons can be increased. That is, the contrast of the foreign matter 10 can be increased.

Now, description will be made in further detail. If the aperture is made small, the secondarily emitted electrons decrease in inverse proportion to the area of the aperture. Accordingly, the gradation of a normal portion becomes small. However, the mirror signal does not change, and the gradation of the foreign matter 10 does not change. Thus, the contrast of the foreign matter 10 can be increased by as much as reduction in gradation therearound, and a high S/N can be achieved.

The aperture may be configured such that the position of the aperture can be adjusted not only in the X and Y directions but also in the Z axis direction. This configuration is also advantageous. The aperture is preferably arranged at a position where the mirror electrons are most narrowed. Accordingly, reduction in the aberration of the mirror electrons and secondarily emitted electrons can be significantly effectively achieved. A higher S/N can therefore be achieved.

As described above, the mirror electrons are significantly sensitive to the NA size and the shape thereof. Accordingly, appropriate selection of the NA size and the shape thereof is significantly important to achieve a high S/N. An example of a configuration for selecting such an appropriate NA size and the shape thereof is hereinafter described. Here, the shape of the aperture (hole) of the NA aperture 62 is also described.

Here, the NA aperture 62 is a member (component) having a hole (opening). Typically, the member is sometimes referred to as an aperture, and the hole (opening) is sometimes referred to as an aperture. In the following description related to the aperture, the member is referred to as an NA aperture in order to discriminate the member (component) from the hole. The hole of the member is referred to as an aperture. The aperture shape is typically referred to as the shape of a hole.

<Inspection Apparatus>

An inspection apparatus of this embodiment is described with reference to the drawings. In this embodiment, the case of application to a semiconductor inspection apparatus and the like is exemplified.

As described above, the inspection apparatus of this embodiment includes: beam generation means for generating any of charged particles or electromagnetic waves as a beam; a primary optical system that irradiates, with the beam, an inspection object held in a working chamber; a secondary optical system that detects secondary charged particles emitted from the inspection object; and an image processing system that forms an image on the basis of the detected secondary charged particles.

In this situation, irradiation energy of the beam is set in an energy region where the mirror electrons are emitted from the inspection object as the secondary charged particles due to the beam irradiation. For example, a landing voltage is set to be not greater than 50 eV.

The secondary optical system includes a camera for detecting the secondary charged particles, a numerical aperture whose position is adjustable along an optical axis direction and a lens that forms an image of the secondary charged particles that have passed through the numerical aperture on an image surface of the camera. And, in the image processing system, the image is formed under an aperture imaging condition where the position of the numerical aperture is located on an object surface to acquire an image.

Furthermore, the primary optical system includes incident angle control means that controls an incident angle of the beam with which the inspection object is irradiated. Also, the image processing system includes shading correction means that provides a shading correction that uses a correcting white image and a correcting black image to an image (NA imaging image) formed under the aperture imaging condition. In such a situation, the correcting white image is created by adding a predetermined gradation value to the NA imaging image and the correcting black image is created by subtracting a predetermined gradation value from the NA imaging image. Note that the gradation value to be added to the NA imaging image may be equal to or different from the gradation value to be subtracted from the NA imaging image.

Here, terms, such as secondary charged particles and mirror electrons, are described. "Secondary charged particles" include a part or mixture of secondarily released electrons, mirror electrons, and photoelectrons. In the case of irradiation with electromagnetic waves, photoelectrons occur from the surface of the sample. When the surface of the sample is irradiated with charged particles, such as electron beam, "secondarily released electrons" occur from the surface of the sample, or "mirror electrons" are formed. The "secondarily released electrons" are caused by collision of an electron beam with the surface of the sample. That is, the "secondarily released electrons" are a part or mixture of the secondary electrons, the reflected electrons, and the backscattering electrons. "Mirror electrons" are the emitted electron beam that does not collide with the surface of the sample and is reflected in proximity to the surface.

Figure 15:
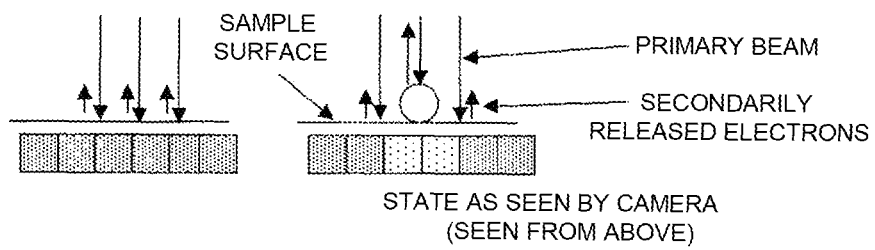
FIG. 15 is a view illustrating the principle.
Figure 15:
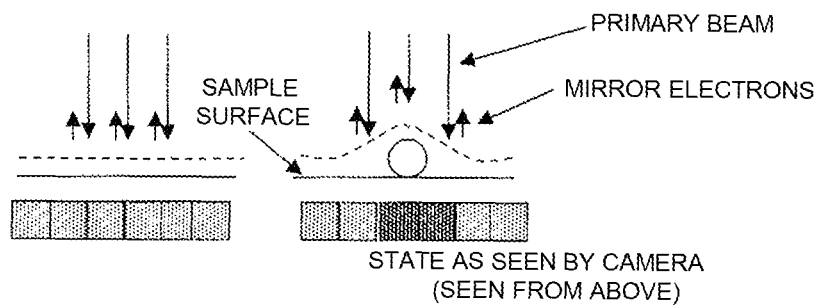

Next, the principle of the present technology will be described with reference to FIG. 15. As shown in FIG. 15A, in the mapping projection system, conventionally, a sample has been irradiated with a primary beam having a certain energy, forming an image on the basis of information about secondarily released electrons occurring from a sample surface. At that time, a landing voltage is between 100 eV and 400 eV. However, in this conventional method, it has been difficult to acquire a large difference in contrast because of use of the secondarily released electrons.

Meanwhile, as shown in FIG. 15B, the landing voltage to be used is set to be not greater than 50 eV and mirror electrons that are reflected to return back are used. In such a situation, a height at which the mirror electrons are reflected changes depending on the state of irregularities in a surface, so that a difference in contrast can be created, thus acquiring a large difference in contrast.

Next, the behavior of the mirror electrons will be described. The mirror electrons differ in orbit from the secondarily released electrons and a method that observes this state uses an NA imaging image (an image acquired under an NA imaging condition). The NA imaging condition means a condition (secondary system aperture imaging condition) where a secondary system aperture disposed on top of an intermediate lens is located on an object surface to acquire an image.

Figure 16:
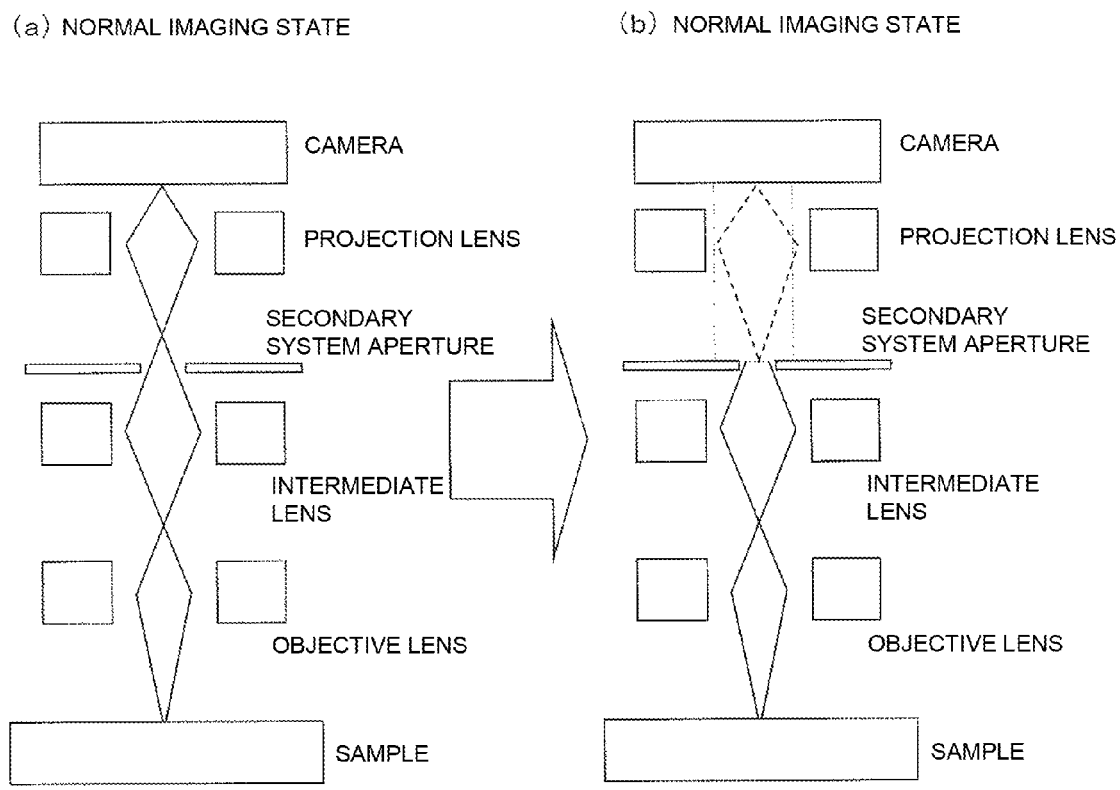
FIG. 16 is a view illustrating an aperture imaging condition (NA imaging condition) in one embodiment.

The NA imaging condition will be described with reference to FIG. 16. In an ordinary state that an image is acquired, the image is acquired by imaging in an electron orbit shown by the solid lines in FIG. 16A, but in the NA imaging condition, the image is acquired by imaging in the electron orbit shown by the dash lines in FIG. 16B. That is, in the NA imaging condition, the state of electrons that have reached the aperture is observed.

Figure 17:
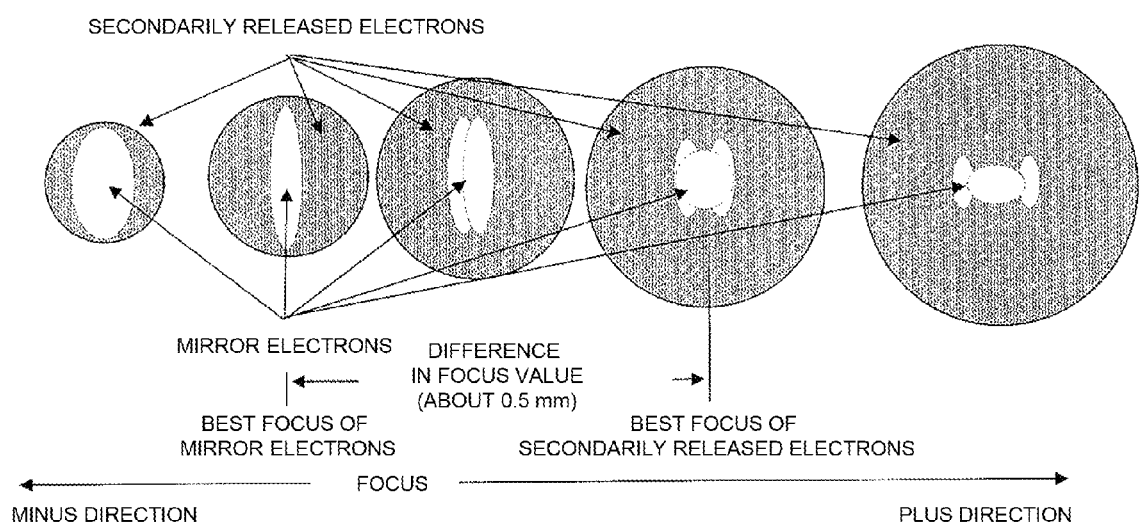
FIG. 17 is a view illustrating a focus adjustment under the NA imaging condition in one embodiment.
Figure 18:
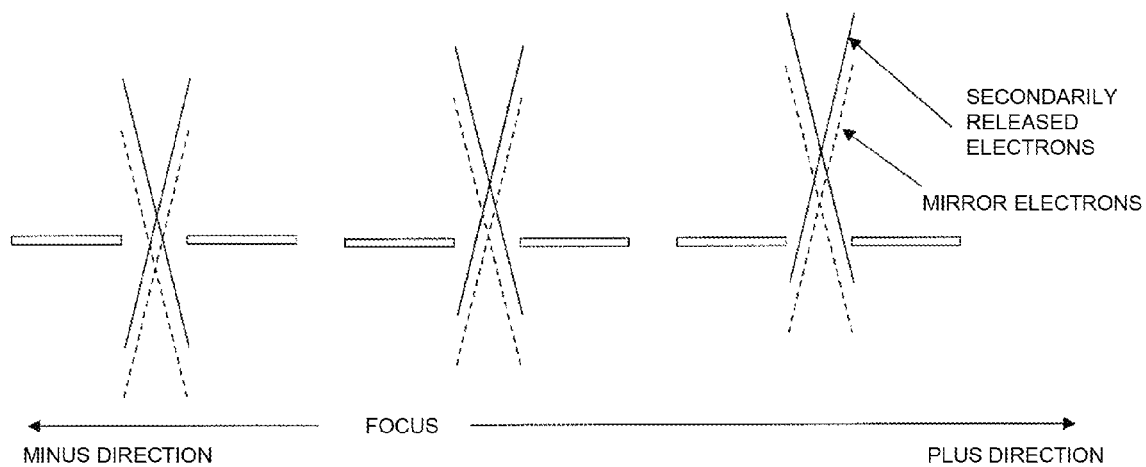
FIG. 18 is a view illustrating the focus adjustment under the NA imaging condition in one embodiment.

And then, a focus adjustment under the NA imaging condition will be described using FIGS. 17 to 20. FIG. 17 is a view illustrating the secondarily released electrons and the mirror electrons under the NA imaging condition. FIG. 18 is a view illustrating crossover points of the mirror electrons and the secondarily released electrons at the aperture as seen from a lateral direction. In FIG. 18, the orbits of the mirror electrons are shown in the dash lines and the orbits of the secondarily released electrons are shown in the solid lines.

As shown in FIGS. 17 and 18, there is a difference in the best focus position between the mirror electrons and the secondarily released electrons (difference in focus value: for example, about 0.5 mm). And, when the focus is changed, a region of the secondarily released electrons becomes larger as the focus moves toward a plus direction, but a region of the mirror electrons becomes long in a longitudinal direction and narrow in a lateral direction at a certain focus point, and beyond this focus point, as the focus is moved toward the plus direction, the region crushes in the longitudinal direction and extends in the lateral direction. Also, as the focus is conversely moved toward a minus direction, a peak changes to be split into two parts (see FIG. 17).

Figure 19:
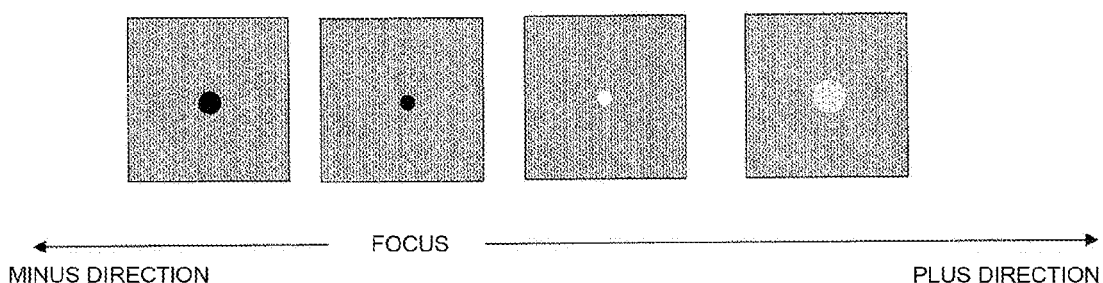
FIG. 19 is a view illustrating the focus adjustment under the NA imaging condition in one embodiment.
Figure 19:
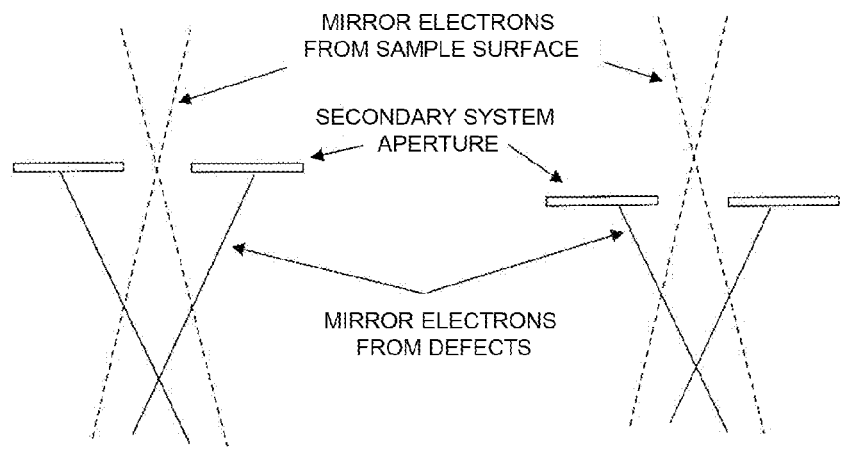

FIG. 19 illustrates how a foreign matter is seen when an image of it is acquired by changing the focus. As shown in FIG. 19A, if the focus is moved toward the minus direction, the foreign matter is seen in the black color. Meanwhile, if the focus is moved toward the plus direction, the foreign matter is seen in the white color. In FIG. 19B, the mirror electrons from a sample surface are shown by the dash lines, and the mirror electrons from foreign matters (defects) are shown by the solid lines. As shown in FIG. 19B, the focus is changed from the minus side to the plus side, resulting in an increased amount of the mirror electrons that pass through the aperture from the foreign matters (defects).

Figure 20:
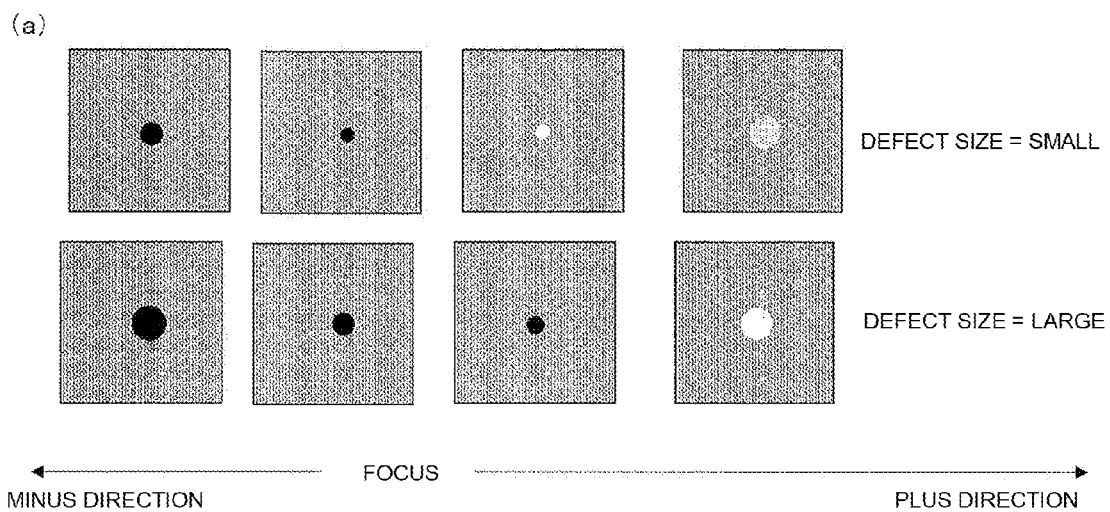
FIG. 20 is a view illustrating the focus adjustment under the NA imaging condition in one embodiment.
Figure 20:
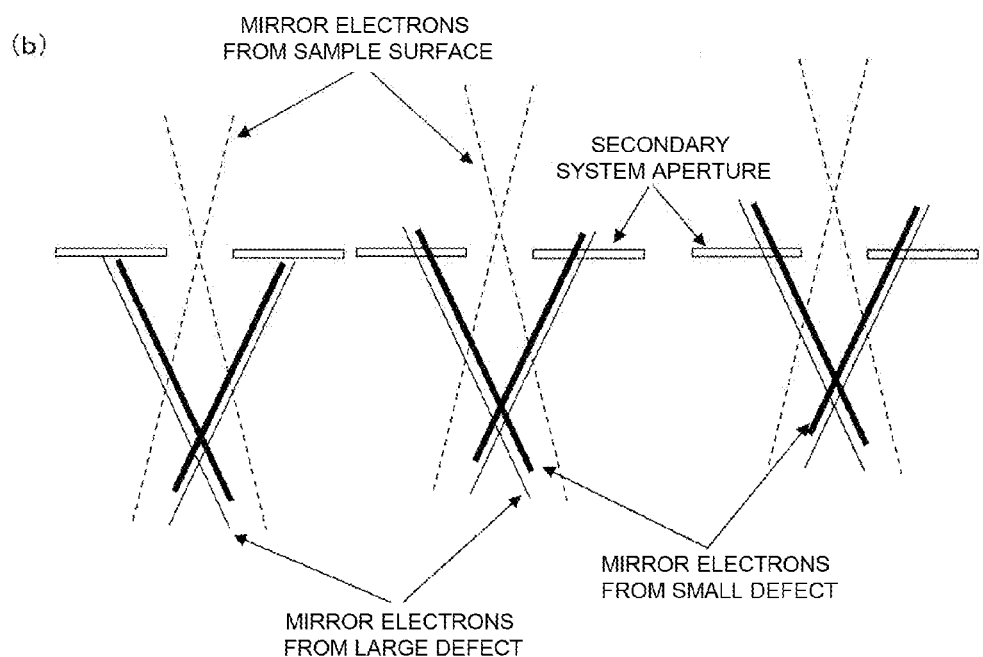

Also, FIG. 20 illustrates how a foreign matter having a different size is seen when an image of it is acquired. As shown in FIG. 20A, the larger the defect is, the more the focus at which black changes to white shifts to the plus side. And, as shown in FIG. 20B, there is an increase in number of the mirror electrons from the small foreign matter that pass through the aperture before the mirror electrons from the large foreign matter do. Note that in FIG. 20B, the mirror electrons from the small foreign matter (defect) are shown by the heavy lines (thick solid lines) and the mirror electrons from the large foreign matter (defect) are shown by the thin lines (thin solid lines).

Figure 21:
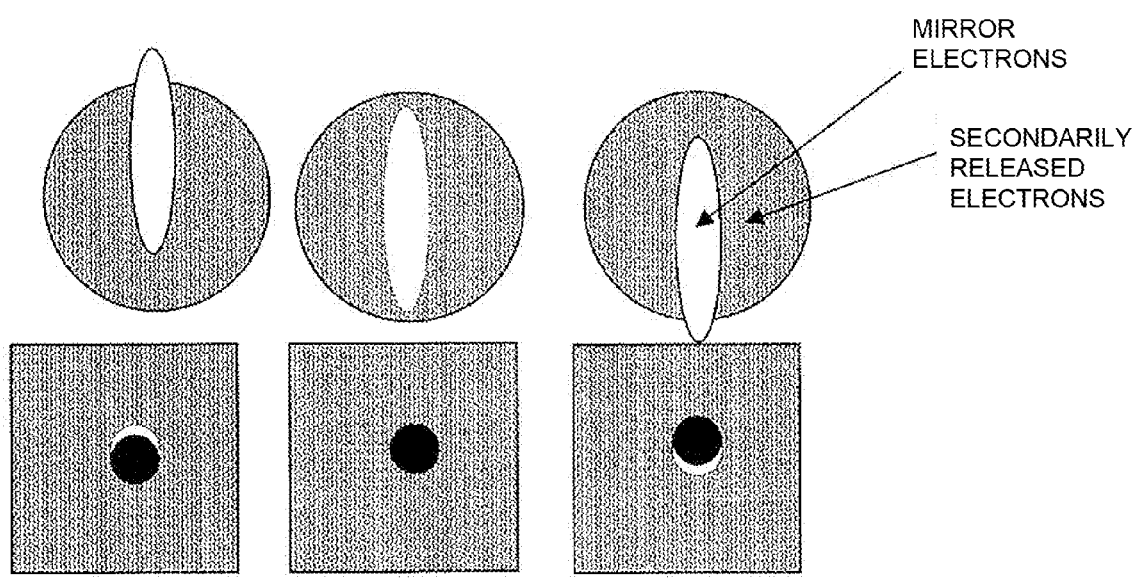
FIG. 21 is a view illustrating a deviation of an incident angle of a primary beam in one embodiment.

Next, the incident angle adjustment of the primary beam will be described with reference to FIGS. 21 to 27. If an incident angle of the primary beam deviates, an orbit of the mirror electrons that pass through the aperture becomes complex. For example, FIG. 21 illustrates how a foreign matter (defect) is seen when the incident angle of the primary beam deviates in a vertical direction. As shown in FIG. 21, if the incident angle of the primary beam deviates, a foreign matter (defect) cannot be identified on the basis of information about white and black. Accordingly, the smaller a foreign matter (defect) is, the more a condition that the foreign matter can be seen in the black color is lost. Therefore, it becomes necessary to adjust the incident angle of the primary beam. Furthermore, as described later, also in the secondary system, it becomes necessary to adjust a crossover point of the mirror electrons to the aperture (see FIGS. 28 to 32).

Figure 22:
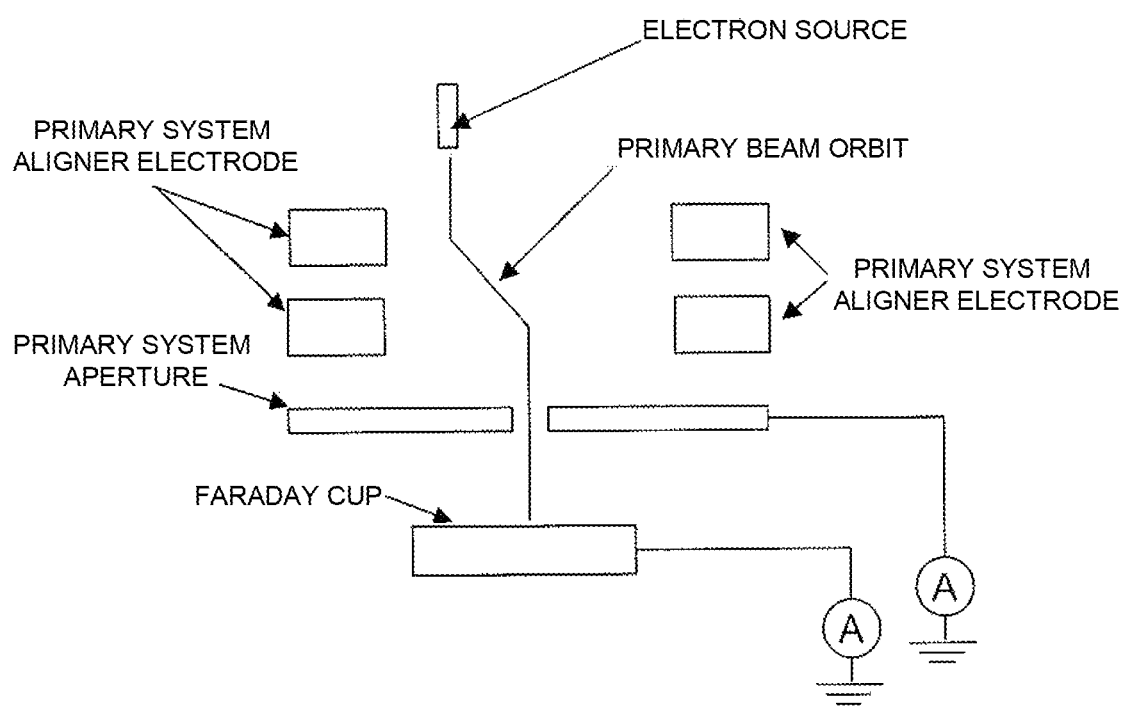
FIG. 22 is a view illustrating a conventional adjustment method of the incident angle of the primary beam.

FIG. 22 is a view illustrating a conventional adjustment method of an incident angle of a primary beam. In the conventional method, a primary system aligner electrode is adjusted so that an orbit of the primary beam passes through the center of a primary system aperture and a current measured value in a Faraday cup becomes maximum. However, in this conventional method, the incident angle of the primary beam is unable to be confirmed. It is because, in the current measurement in the Faraday cup, only the current that has reached is measured and information about an angular component cannot be acquired (if the primary beams have identical current densities, there is not a difference in current value). However, because an image is conventionally acquired under a condition where the primary beam has landed, there has not been a problem with the incident angle of the primary beam.

Figure 23:
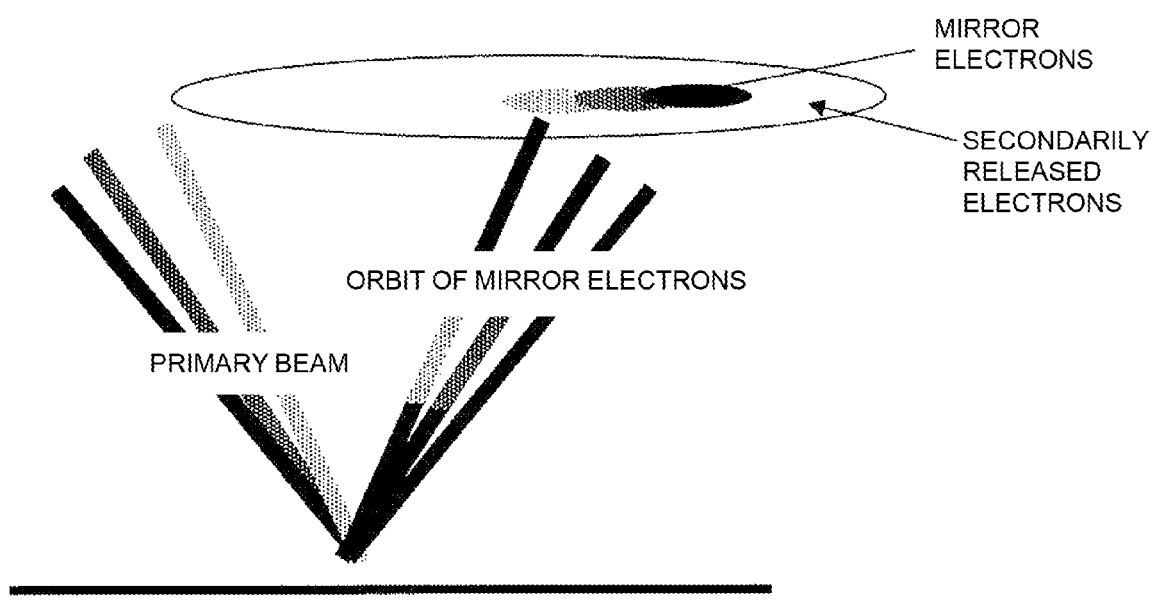
FIG. 23 is a view illustrating an incident angle adjustment under the NA imaging condition in one embodiment.

The incident angle adjustment is provided by using the NA imaging condition and adjusting a position of the mirror electrons. FIG. 23 shows the relation between the mirror electrons and the incident angle of the primary beam on an NA image. As shown in FIG. 23, from an image acquired by NA imaging, the incident angle of the primary beam can be acquired.

Figure 24:
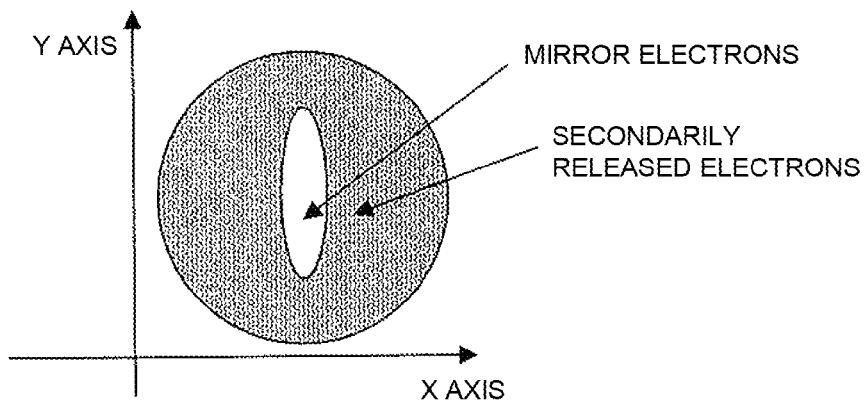
FIG. 24 is a view illustrating how an NA imaging image is seen if the incident angle differs in one embodiment.
Figure 24:
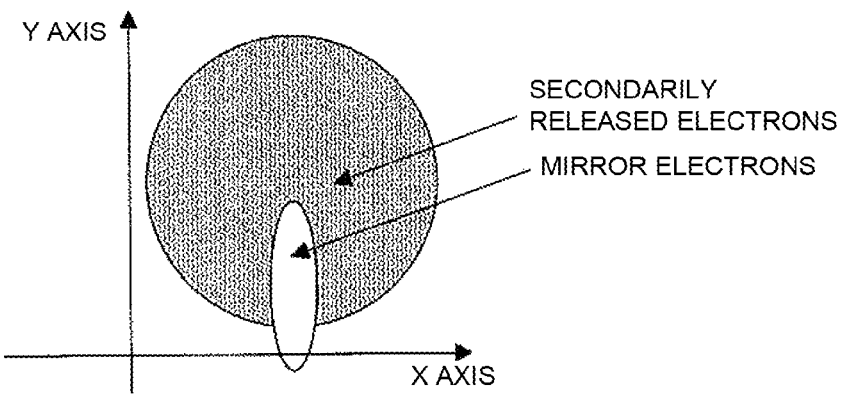
Figure 24:
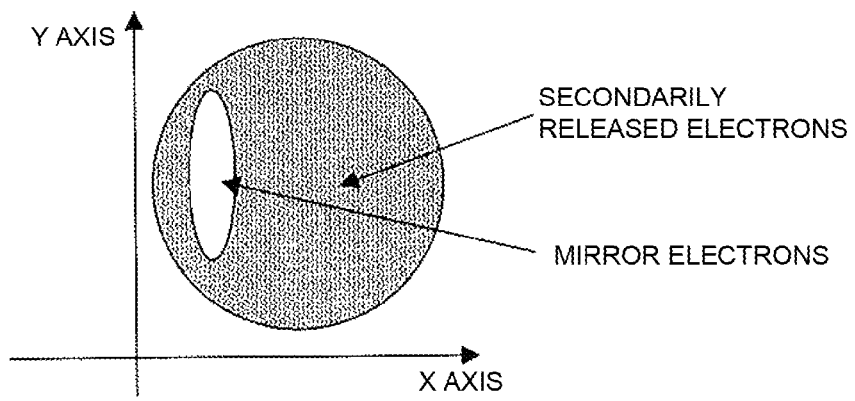

FIG. 24 is a view illustrating how the NA imaging image is seen if the incident angle is different. As shown in FIG. 24A, in the case of normal incidence, the mirror electrons are located in the central area of the secondarily released electrons. Also, as shown in FIG. 24B, if the incident angle tilts toward a Y axis direction, the mirror electrons deviate from the secondarily released electrons toward the Y axis direction. Furthermore, as shown in FIG. 24C, if the incident angle tilts toward an X axis direction, the mirror electrons deviate from the secondarily released electrons toward the X axis direction.

Figure 25:
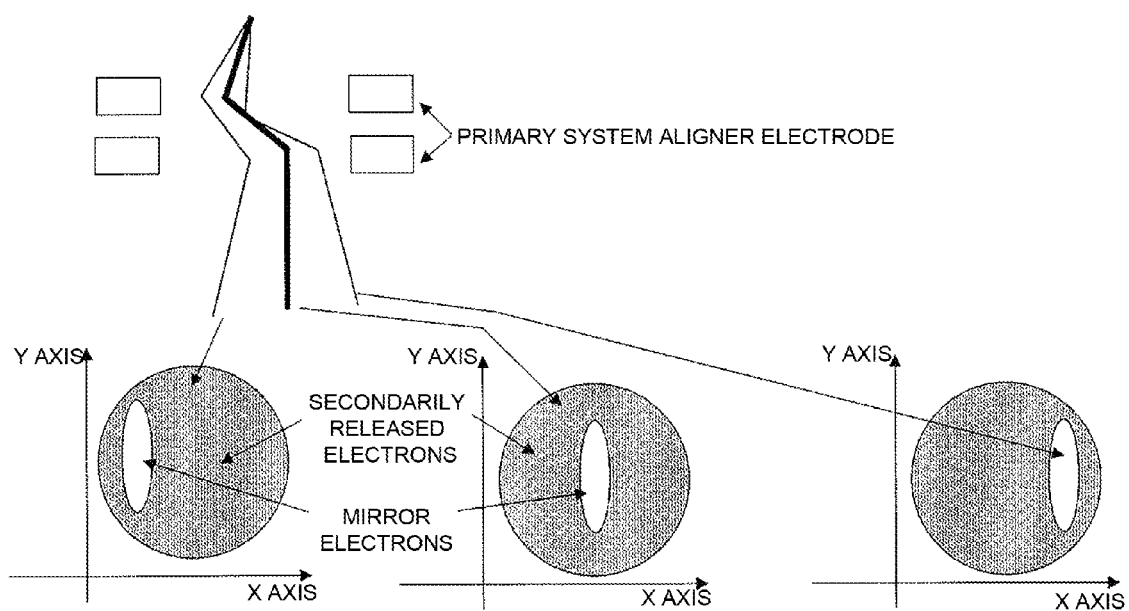
FIG. 25 is a view illustrating an adjustment method of the incident angle of the primary beam in one embodiment.
Figure 26:
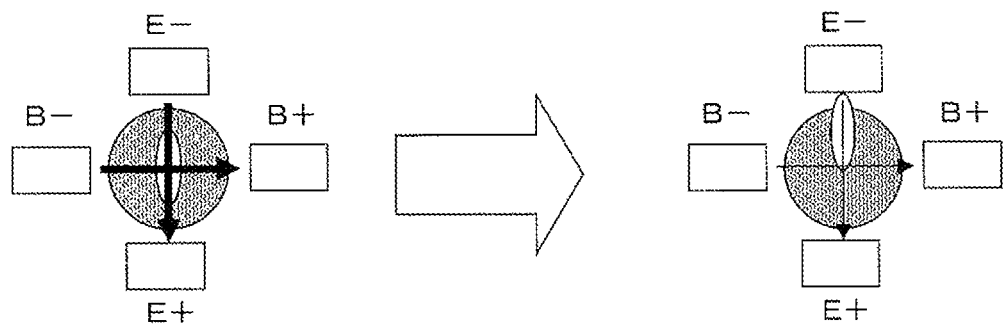
FIG. 26 is a view illustrating the adjustment method of the incident angle of the primary beam in one embodiment.
Figure 26:
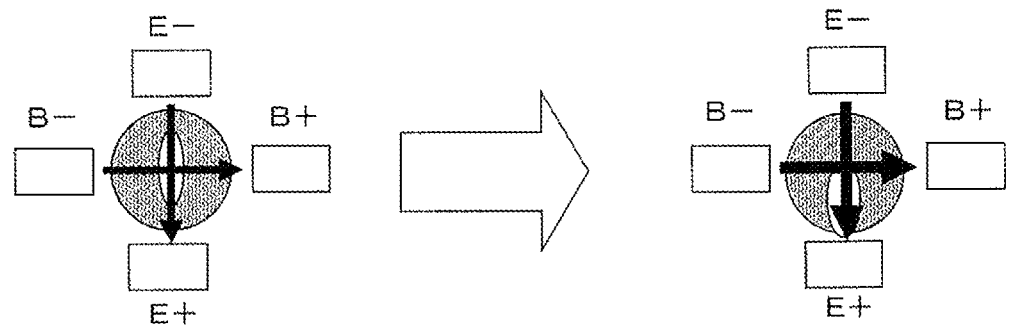

If the incident angle of the primary beam tilts, for example, as shown in FIG. 25, the incident angle can be adjusted by using the aligner electrode of the primary beam. Also, as shown in FIG. 26, the incident angle can be adjusted by using a Wien filter (E×B).

Figure 27:
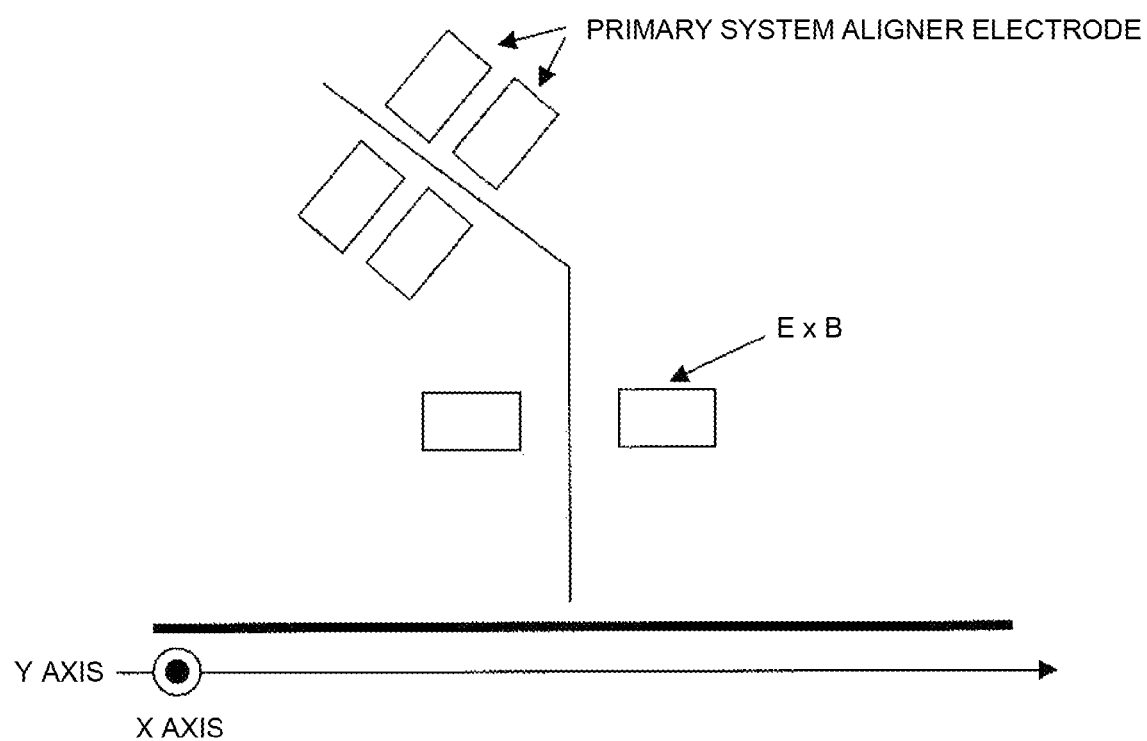
FIG. 27 is a view illustrating the adjustment method of the incident angle of the primary beam in one embodiment.

In this embodiment, as shown in FIG. 27, irradiation of the primary beam is carried out via E×B. That is, the primary beam is incident on E×B obliquely from above in the Y axis direction. In such a situation, the incident angle adjustment in the X axis direction can be provided by adjusting an electrode voltage of the primary system aligner in the X axis direction. Also, the incident angle adjustment in the Y axis direction can be provided by using E×B.

Figure 28:
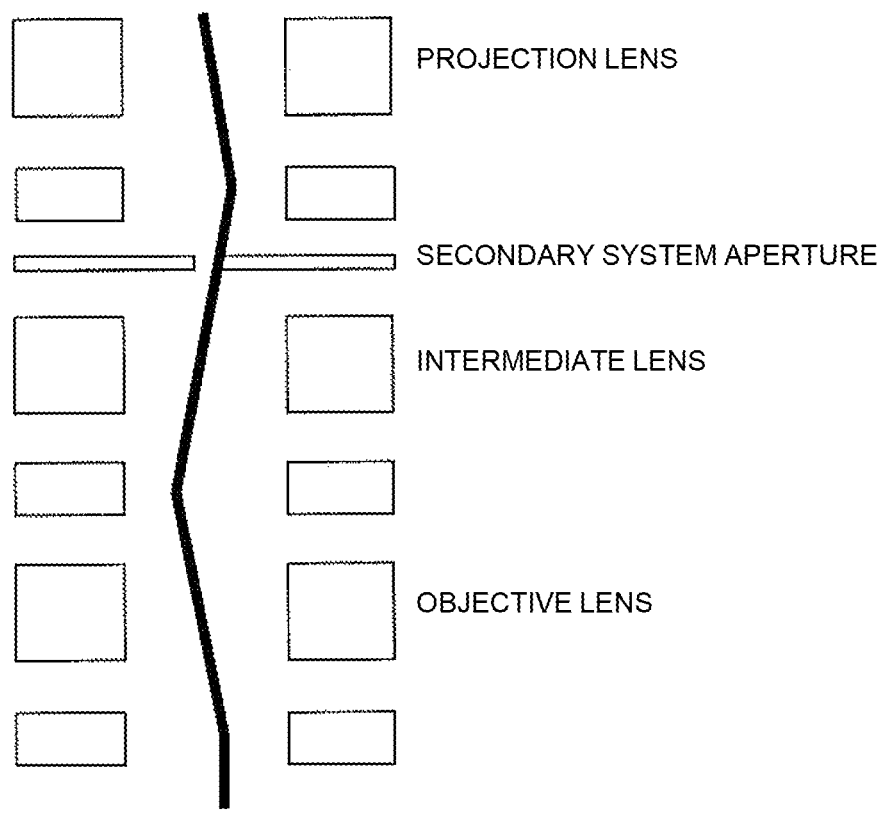
FIG. 28 is a view illustrating a conventional adjustment method of a secondary system.

Next, the adjustment of the secondary system will be described with reference to FIGS. 28 to 32. FIG. 28 is a view illustrating a conventional adjustment method of the secondary system. As shown in FIG. 28, conventionally, in an adjustment method of an imaging condition by using an electron beam inspection apparatus according to a mapping projection system, only the optical axis is confirmed. In particular, a voltage value of an electric field lens is automatically changed at a certain value and at a certain frequency, and from a change in image at this time, whether there is a deviation from the center of the electrode or not is recognized and if the deviation occurs, the aligner is adjusted so that the optical axis passes through the center of the electrode. But the conventional technique is an adjustment method for passing the secondarily released electrons and the mirror electrons through the center of the electrode, and a crossover position is not adjusted at the aperture.

Figure 29:
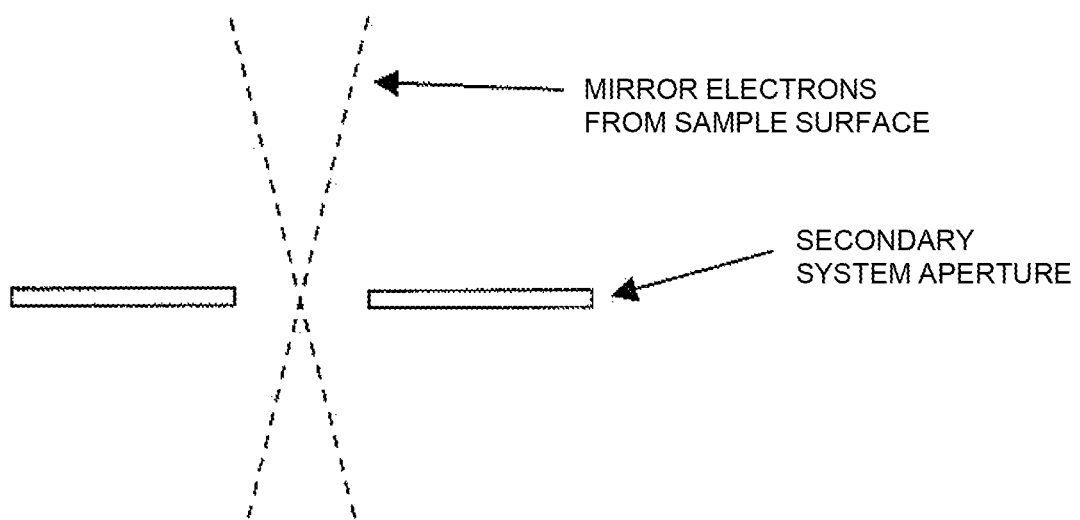
FIG. 29 is a view illustrating an adjustment method of the secondary system in one embodiment.
Figure 30:
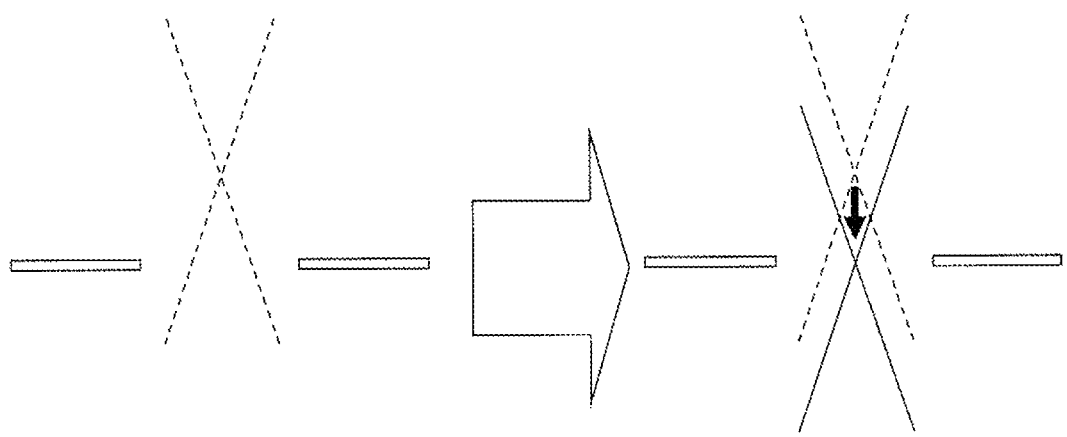
FIG. 30 is a view illustrating the adjustment method of the secondary system in one embodiment.

When foreign matters are observed by using the mirror electrons, as shown in FIG. 29, it is necessary to align a crossover of the mirror electrons emitted from a sample with the center of the aperture. Then, as shown in FIG. 30, the orbit of the mirror electrons is moved to align the crossover. For example, an objective lens condition is adjusted so that the crossover can be aligned. In particular, a focus condition is adjusted by using a focus electrode of the objective lens so that the crossover point of the mirror electrons can be aligned with the height of the aperture. Also, newly introducing an adjusting electrode can allow parameter adjustment for the alignment.

Figure 31:
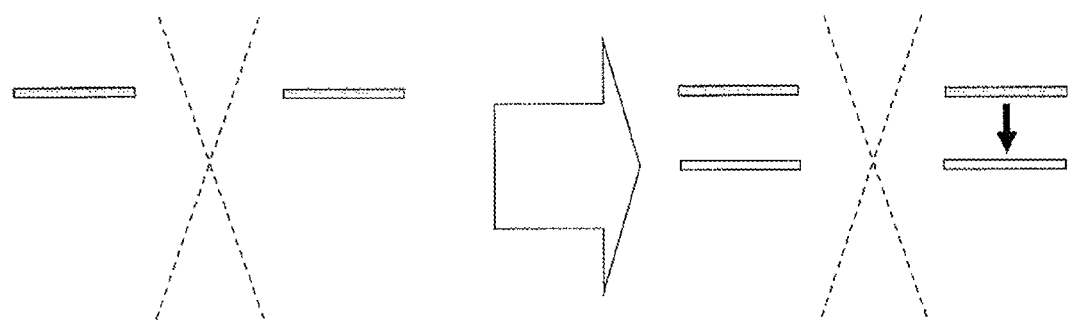
FIG. 31 is a view illustrating the adjustment method of the secondary system in one embodiment.
Figure 31:
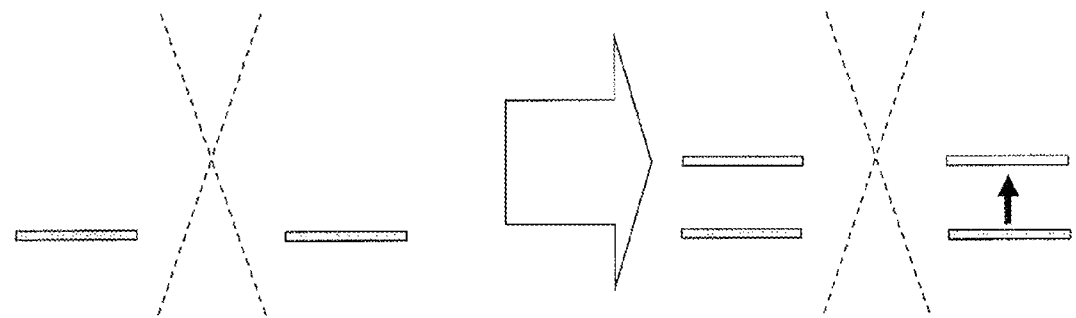
Figure 32:
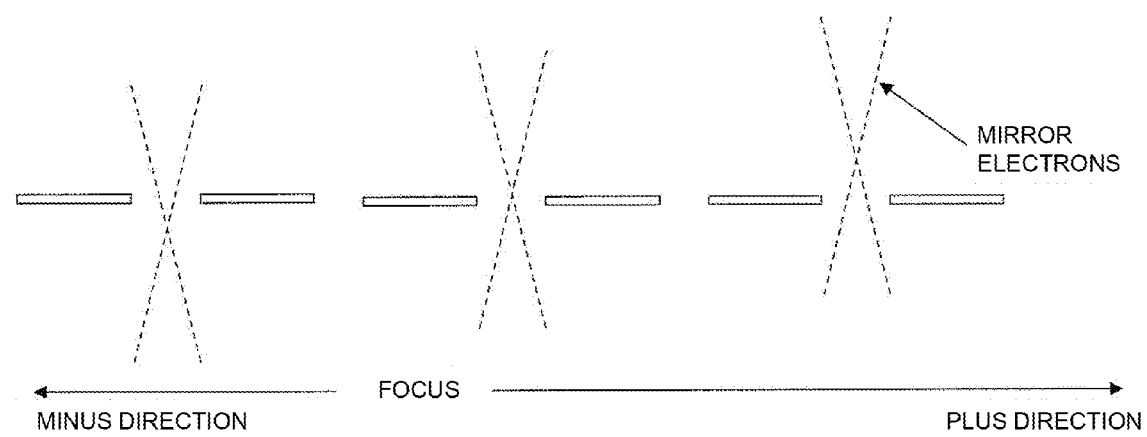
FIG. 32 is a view illustrating the adjustment method of the secondary system in one embodiment.

There is, for example, a method to move the secondary system aperture in which, as shown in FIG. 31, the aperture is brought into a movable state in a Z direction and moved so that the height of the aperture can be made equal to a height of the crossover point of the mirror electrons. Furthermore, as shown in FIG. 32, the adjustment can be also provided by changing the focus electrode of the objective lens. Such an adjustment can allow an image of fine foreign matters in a sample surface (for example, foreign matters of 30 nm in size) to be acquired.

Finally, the shading correction will be described with reference to FIGS. 33 to 35. The shading correction can allow smaller foreign matters (for example, foreign matters of 20 nm in size) to be detected.

Figure 33:
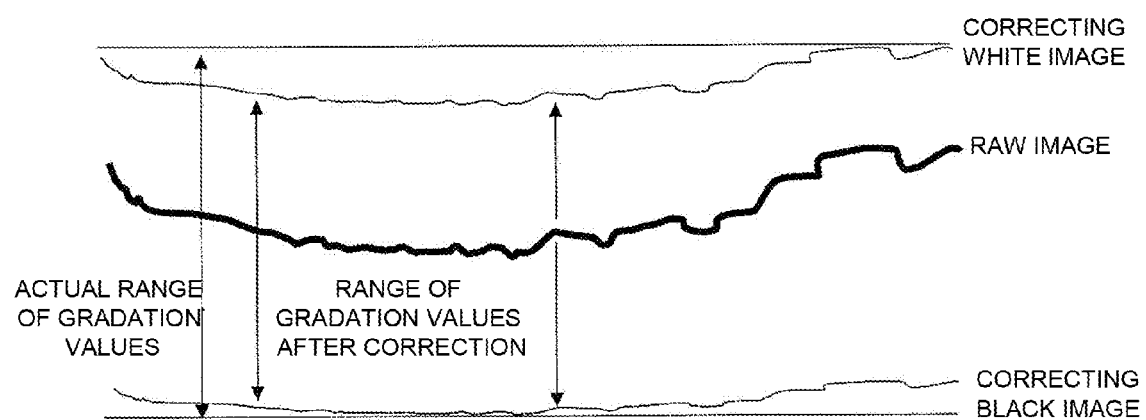
FIG. 33 is a view illustrating a conventional shading correction.
Figure 34:
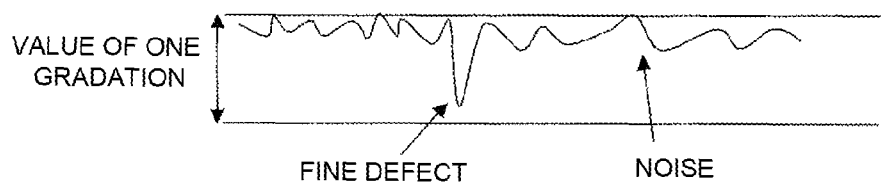
FIG. 34 is a view illustrating a shading correction in one embodiment.
Figure 34:
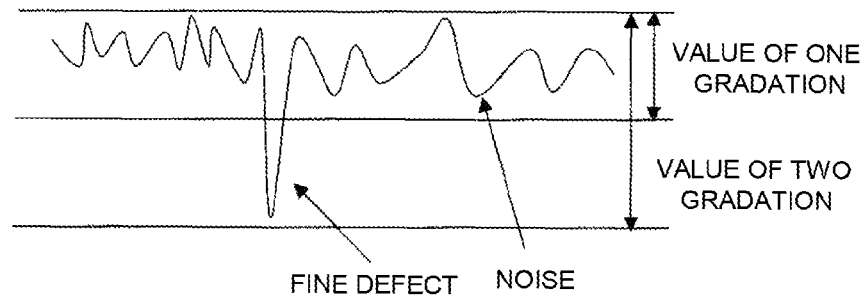

FIG. 33 is a view illustrating a conventional shading correction. As shown in FIG. 33, in a conventional correction method, a brighter image (correcting white image) and a darker image (correcting black image) than a raw image are taken in to provide a correction that uses cross-section gradation values of these images. For example, the correcting white image is created by using a gain of the camera so that the raw image approximates the maximum gradation value. Also, the correcting black image is created by taking in an image without a primary irradiation electron beam being projected.

However, in the conventional method, if foreign matters (defects) are small, electronic information about the defects (fine defects) is less and may be mixed with a noise of the image. For example, as shown in FIG. 34A, if a difference between the gradation values of the noise and the fine defect is not greater than 1, the noise may be detected even though a threshold value is adjusted. Therefore, it has been desired to further enhance sensitivity.

In this embodiment, the correcting white and black images are set in a range smaller than an actual range of gradation values. Accordingly, as shown in FIG. 34B, information about defects is emphasized. In such a situation, also the noise is emphasized, but the noise can be removed using the threshold value if it falls within an adjustment range of the threshold value. For example, the threshold value is, as shown in FIG. 34B, adjusted so that only the defect signal can be detected.

Figure 35:
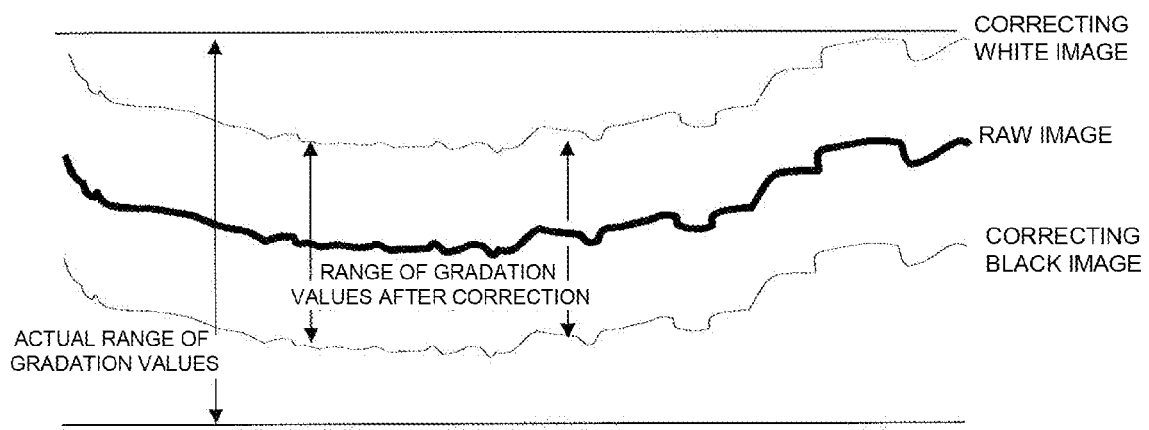
FIG. 35 is a view illustrating the shading correction in one embodiment.

FIG. 35 is a view illustrating the shading correction according to this embodiment. In this embodiment, the raw image is processed to create the correcting white image and the correcting black image. In such a situation, a value is calculated in a manner that the defects are emphasized and the noise does not become too large. And, only the gradation value corresponding to the calculated value is added to the gradation value of the raw image, thus creating the correcting white image. Also, only the gradation value corresponding to the added value is subtracted from the gradation value of the raw image, thus creating the correcting black image. Furthermore, also a gain of EB-TDI can be adjusted to create the correcting white image and the correcting black image.

For example, if the raw image is acquired in 0 to 255 gradations, the raw image brightened by 40 gradations is used to acquire the correcting white image. Also, the raw image darkened by 40 gradations is used to acquire the correcting black image. By using the correcting white image and the correcting black image, a width of 80 gradations can be enlarged to that of 255 gradations, providing an inspection. As the result, fine foreign matters (for example, foreign matters of 20 nm in size) in a sample surface can be detected.

In the inspection apparatus according to such an embodiment, the inspection of irregularities in a surface of an inspection object can be provided with high contrast.

In this embodiment, when the inspection object is irradiated with the beam, the mirror electrons are emitted from the inspection object. Because the height at which the mirror electrons are reflected changes depending on irregularities in the surface of the inspection object, a difference in contrast is generated. Also, the mirror electrons differ in orbit from the secondarily released electrons. In such a situation, the image is formed under the imaging condition (aperture imaging condition) where the position of the numerical aperture is located on the object surface to acquire an image. That is, the crossover of the mirror electrons is aligned with the center of the numerical aperture. Accordingly, the inspection of irregularities in a surface of an inspection object can be provided with high contrast.

Furthermore, in this embodiment, the focus is adjusted under the aperture imaging condition. For example, when the focus is moved toward the minus direction, the foreign matters in the surface of the inspection object come to be seen in the black color. Conversely, when the focus is moved toward the plus direction, the foreign matters in the surface of the inspection object come to be seen in the white color. Therefore, the inspection of irregularities in a surface of an inspection object can be provided with high contrast.

Also, in this embodiment, the incident angle of the beam with which the inspection object is irradiated is controlled. For example, the incident angle of the beam with which the inspection object is irradiated is controlled so that the incident angle of the beam is made normal. Therefore, the inspection of irregularities in a surface of an inspection object can be provided with high contrast and small foreign matters (for example, foreign matters of 30 nm in size) can be detected.

Furthermore, in this embodiment, the shading correction that uses the correcting white image and the correcting black image is provided to the image formed under the aperture imaging condition. In such a situation, the correcting white image is created by adding the predetermined gradation value (for example, 40 gradations) to the image, and the correcting black image is created by subtracting the predetermined gradation value (for example, 40 gradations) from the image. The width between the gradation values of the correcting white image and the correcting black image is narrowed, so that irregularities (defects) in an inspection object can be emphasized. Therefore, smaller foreign matters (for example, foreign matters of 20 nm in size) can be detected.

As stated above, the inspection apparatus has an advantageous effect that the inspection of irregularities in a surface of an inspection object can be provided with high contrast and is useful as, for example, a semiconductor inspection apparatus.

What is claimed is:

1. An inspection apparatus, comprising:
    beam generation means that generates any of charged particles and electromagnetic waves as a beam;
    a primary optical system that irradiates an inspection object held in a working chamber with the beam;
    a secondary optical system that detects secondary charged particles occurring from the inspection object; and
    an image processing system that forms an image on the basis of the detected secondary charged particles, wherein
    irradiation energy of the beam is set in an energy region where mirror electrons are emitted from the inspection object as the secondary charged particles due to the beam irradiation,
    the secondary optical system comprises a camera for detecting the secondary charged particles, a numerical aperture whose position is adjustable along an optical axis direction and a lens that forms an image of the secondary charged particles that have passed through the numerical aperture on an image surface of the camera, and
    in the image processing system, the image is formed under an aperture imaging condition where the position of the numerical aperture is located on an object surface to acquire an image.

2. The inspection apparatus according to claim 1, wherein the secondary optical system comprises focus adjusting means that adjusts a focus under the aperture imaging condition.

3. The inspection apparatus according to claim 1, wherein the primary optical system comprises incident angle control means that controls an incident angle of the beam with which the inspection object is irradiated.

4. The inspection apparatus according to claim 1, wherein the image processing system comprises shading correction means that provides a shading correction that uses a correcting white image and a correcting black image to the image formed under the aperture imaging condition, and
    the correcting white image is created by adding a predetermined gradation value to the image and the correcting black image is created by subtracting a predetermined gradation value from the image.

* * * * *